(12) United States Patent
Morishita

(10) Patent No.: US 6,489,618 B1
(45) Date of Patent: Dec. 3, 2002

(54) RADIATION IMAGE PICKUP DEVICE

(75) Inventor: Masakazu Morishita, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 98 days.

(21) Appl. No.: 09/627,446

(22) Filed: Jul. 27, 2000

(30) Foreign Application Priority Data

Jul. 30, 1999 (JP) .......................................... 11-217410

(51) Int. Cl.$^7$ ................................................ G01T 1/24
(52) U.S. Cl. ............................................... 250/370.09
(58) Field of Search .......................... 250/370.09, 338.4

(56) References Cited

U.S. PATENT DOCUMENTS 5,401,952 A 3/1995 Sugawa .................... 250/280.1
5,442,176 A * 8/1995 Eckel et al. ................ 250/332

FOREIGN PATENT DOCUMENTS

JP 5-211321 8/1993

* cited by examiner

*Primary Examiner*—Constantine Hannaher
(74) *Attorney, Agent, or Firm*—Fitzpatrick, Cella, Harper & Scinto

(57) ABSTRACT

A radiation image pickup device having the linearity of a sensor sensitivity preferably used for medical care and non-destructive examination. The radiation image pickup device comprises a plurality of input pixels comprising electric charge converting means for converting an incident radiation into electric charges, electric charge storing means for storing the electric charges converted by the electric charge converting means, and control means for controlling an electric field applied to the electric charge converting means, provided between the electric charge converting means and the electric charge storing means. Reading means is provided for reading the electric charges stored in the electric charge storing means or for reading a signal based on the potential due to electric charges stored in the electric charge storing means. An output line outputs the electric charges read from the plurality of input pixels, connected with the plurality of input pixels, and switching means resets the electric charge storing means.

46 Claims, 30 Drawing Sheets

LINEAR ABSORPTION OF TlBr, CsI, AND Se

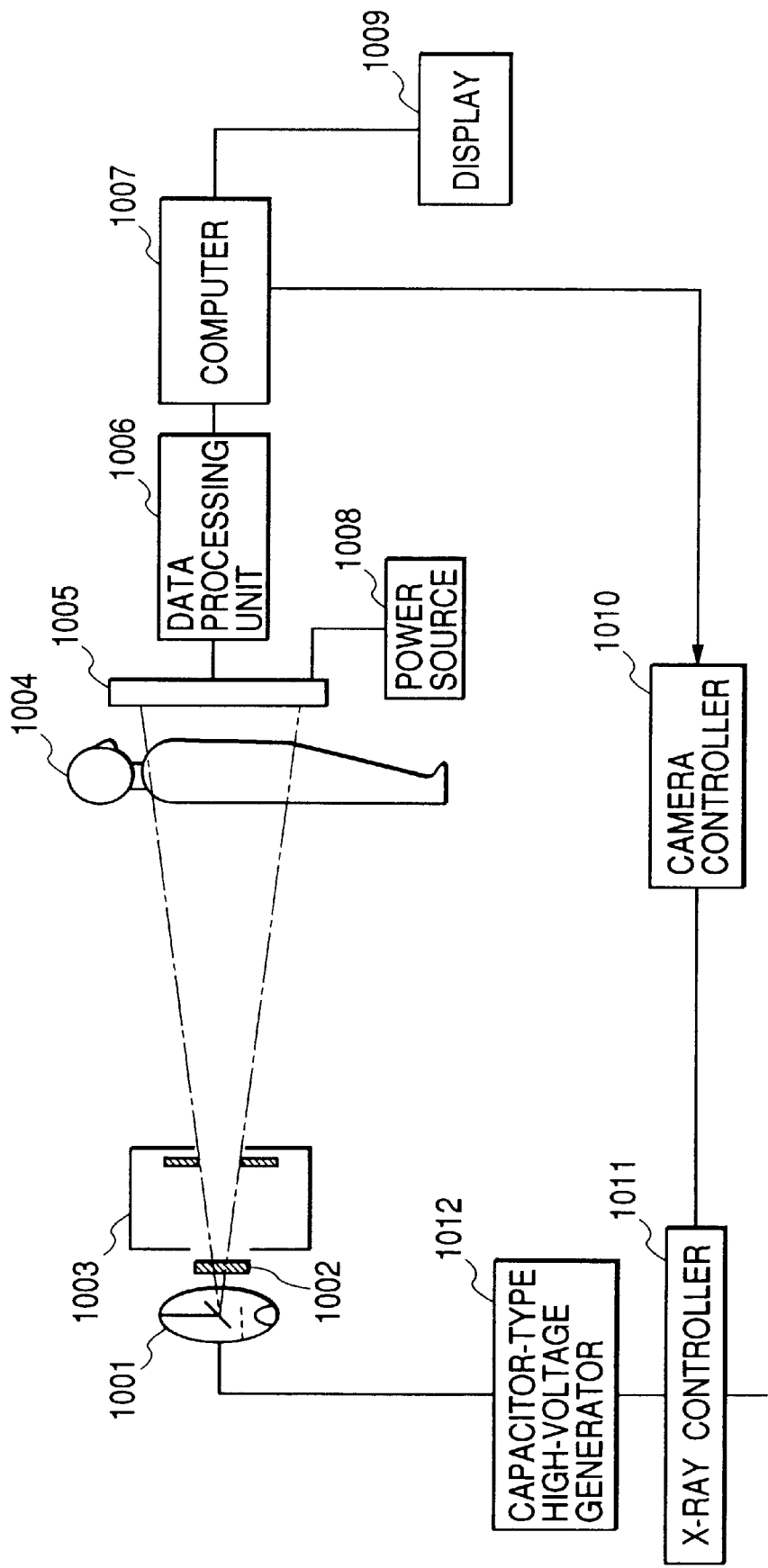

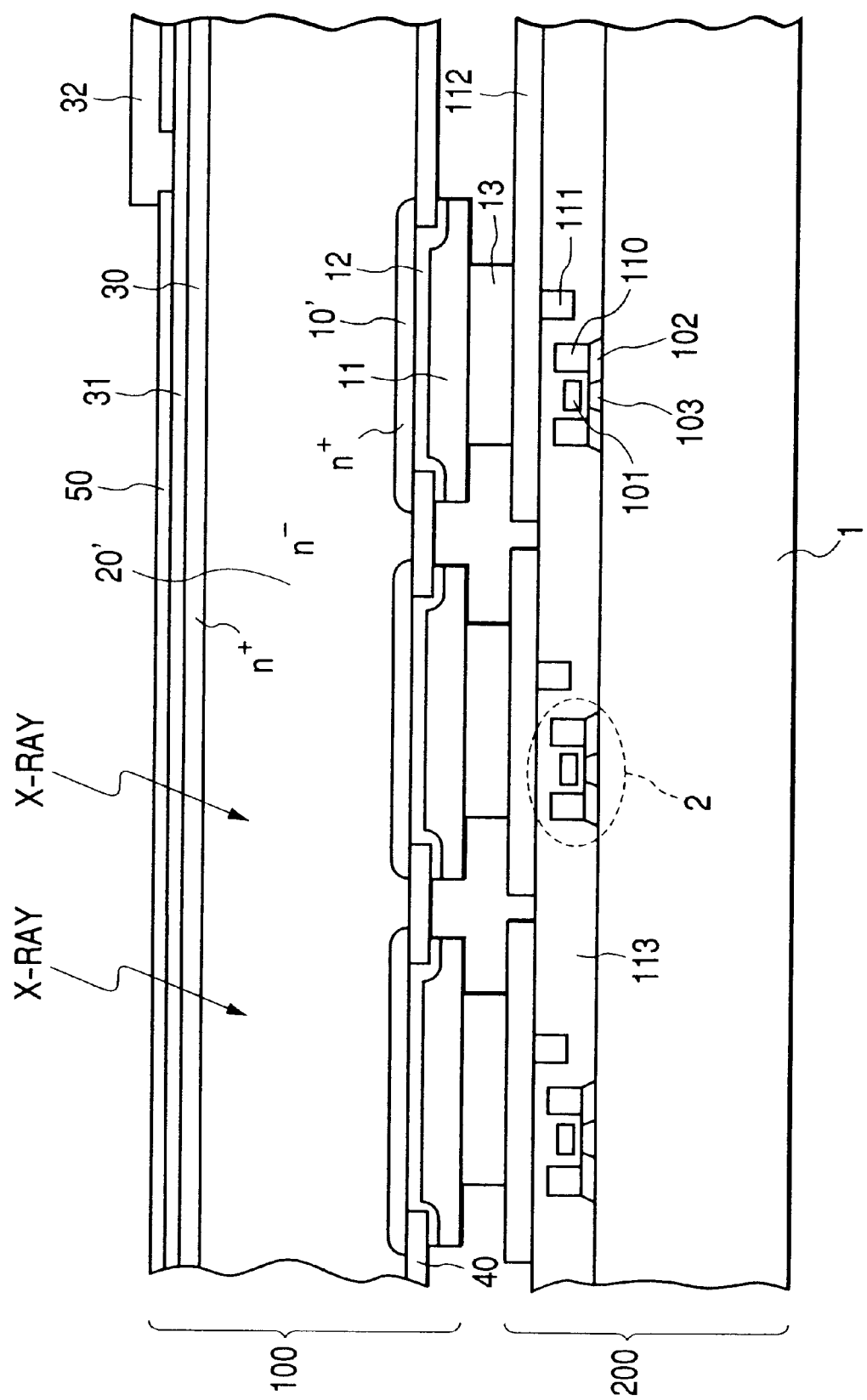

RADIATION IMAGE PICKUP DEVICE

BACKGROUND OF THE INVENTION

1. Field of the Invention

The present invention relates to a radiation image pickup device, and more particularly to a radiation image pickup device which can be preferably applied for converting a radiation image such as an x-ray image which penetrates an object to be examined such as a human body into an electric image.

2. Related Background Art

As an x-ray image pickup device that converts an x-ray, which is one form of radiation, into an electric signal, there exists a system, in which an image intensifier (I.I.), which converts an x-ray into light, a television camera and a television set are combined together to obtain an x-ray image (I.I.-TV system). The system is designed such that the x-ray input face size of the image intensifier is of a photographable size. The input face provides about a 16-inch view field, at maximum.

The x-ray image, converted into light, is imaged once on an image intensifier output portion. The output image is picked up by the television camera through an optical system and then outputted as an electric image. In this system, the x-ray image can be observed in real-time.

However, such convention systems typically have insufficient resolution. Also, because a photographing device is large in size, as compared with film, the location of the photographing device is limited, the movement of the system is limited, and so on.

SUMMARY OF THE INVENTION

The present invention has been made in view of the above circumstances, and therefore an object of the present invention is to provide a radiation image pickup device which is capable of preferably employing the x-ray image pickup device.

Another object of the present invention is to provide a radiation image pickup device that has excellent sensitivity to incident radiation.

Still another object of the present invention is to provide a radiation image pickup device which is capable of preventing carrier over-flow through a switch even if an excessive input is made.

Still another object of the present invention is to provide a radiation image pickup device which is capable of reducing a residual image and conducting an electrical conversion of stable image information.

Yet still another object of the present invention is to provide a radiation image pickup device which is capable of making the sensitivity higher.

In order to achieve the above objects, according to the present invention, there is provided a radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line for outputting the electric charges read from the plurality of input pixels, connected to the plurality of input pixels; and switching means for resetting the electric charge storing means.

Also, according to the present invention, there is provided a radiation image pickup device, comprising:

electric charge converting means for converting an incident radiation into electric charges;

electric charge storing means for storing the electric charges converted by the electric charge converting means;

control means for controlling an electric field applied to the electric charge converting means, provided between the electric charge converting means and the electric charge storing means; and reading means for reading a signal based on a potential due to the electric charges stored in the electric charge storing means.

In the present invention, the type of radiation is not limited to x-rays, but may include electromagnetic waves such as α-rays, β-rays or γ-rays. However, the radiation is generally x-ray radiation.

BRIEF DESCRIPTION OF THE DRAWINGS

FIG. 21 is a schematic structural diagram showing an example of a non-destructive examining device typified by a medical diagnosing device using the radiation image pickup device of the present invention.

FIG. 24 is a schematically cross-sectional view for explanation of a case in which a single crystal semiconductor is used as a high-resistive x-ray detecting portion.

DESCRIPTION OF THE PREFERRED EMBODIMENTS

Now, a description will be given in more detail of preferred embodiments of the present invention with reference to the accompanying drawings.

Figure 1:
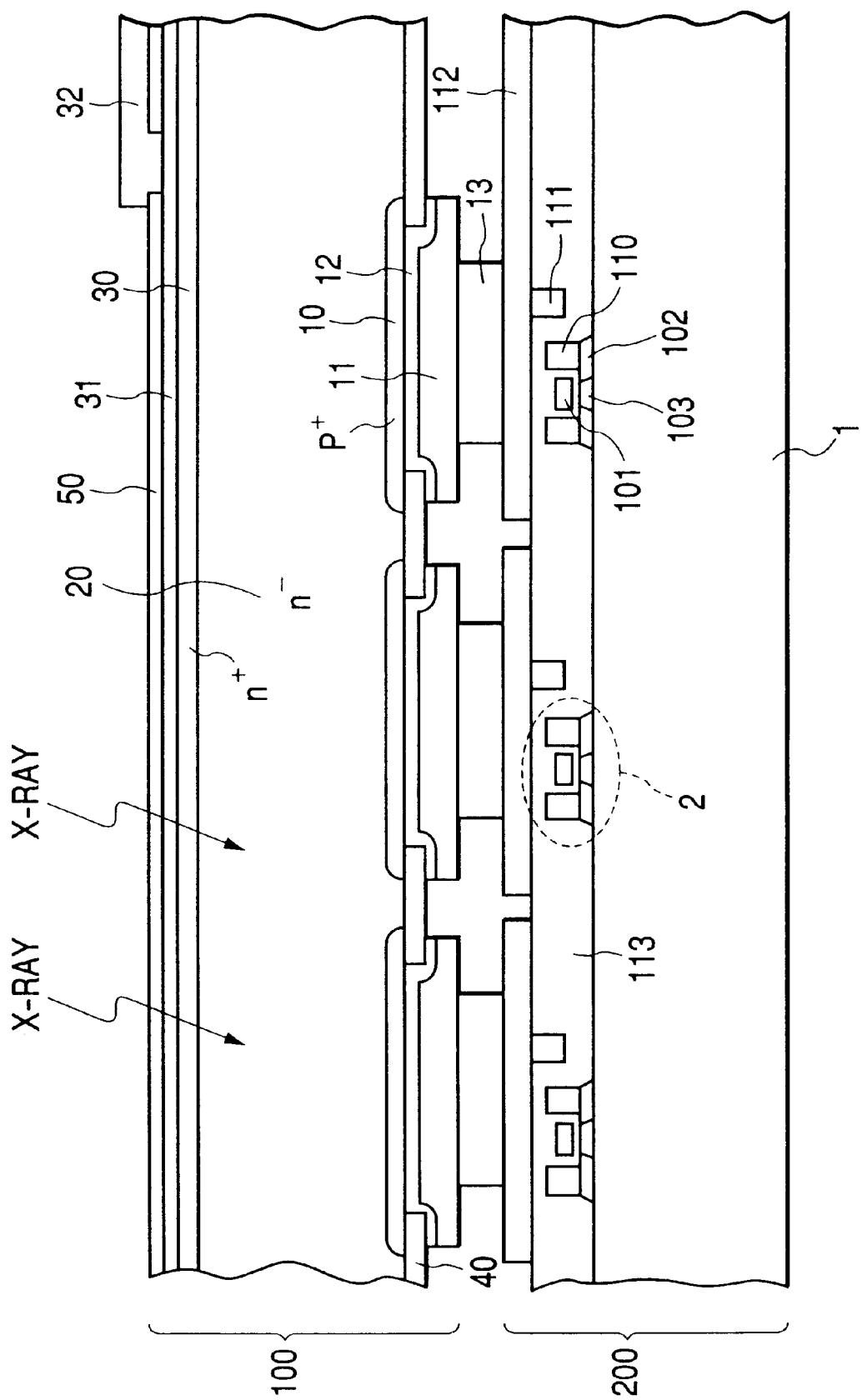
FIG. 1 is a schematically cross-sectional view showing an x-ray sensor for explanation of an example of a radiation image pickup device in accordance with the present invention.

FIG. 1 is a schematic cross-sectional view showing an x-ray sensor in accordance with the present invention. Referring to FIG. 1, reference numeral 100 denotes a sensing portion which produces electrons and positive holes by irradiation of x-rays. One of the produced carriers is stored and then read out as a signal having image information. Reference numeral 200 denotes an electric carrier reading portion where, among other things, a transistor 2 is formed on an insulating substrate 1.

The x-ray sensing portion 100 is formed of a $p^+$ layer 10, an $n^-$ (or i) layer 20 and an $n^+$ layer 30 made of semiconductor material such as GaAs, GaP, Ge or Si. A depletion layer is formed of a pin diode extending from an interface of the $p^+$ layer 10 and the $n^-$ layer 20. Metal layers 31 and 32 are formed on the $n^+$ layer 30, and metal layers 11 and 12 are formed under the $p^+$ layer 10. The metal layer 12 is made of a barrier metal. In the figure, reference numerals 40 and 50 denote protective films. The x-ray sensing portion 100 can be formed on the above-described single crystal substrate made of semiconductor material.

The reading portion 200 has a transistor 2 that constitutes a circuit on the insulating substrate 1. The transistor 2 is made up of a gate 101, a source, a drain 102, an active layer 103 and a metal wiring 110 connected with the source and the drain. The transistor 2 is covered with the protective film 113. The preferred semiconductor material of the thin film transistor may be non-single crystal material such as amorphous silicon, polysilicon or microcrystal silicon. Because these can be fabricated on a large-area glass substrate at a low temperature of 400° C. or less, this is optimum to the radiation image pickup device having a large-scaled sensor face using a large-area substrate. Reference numeral 111 denotes an Al layer and reference numeral 112 is a metal layer. Although being not shown in FIG. 1, the reading portion 200 also includes a capacitance.

The metal layer 112 of the reading portion 200 and the metal layer 11 of the x-ray sensing portion 100 are connected to each other by a bump metal 13.

Figure 2:
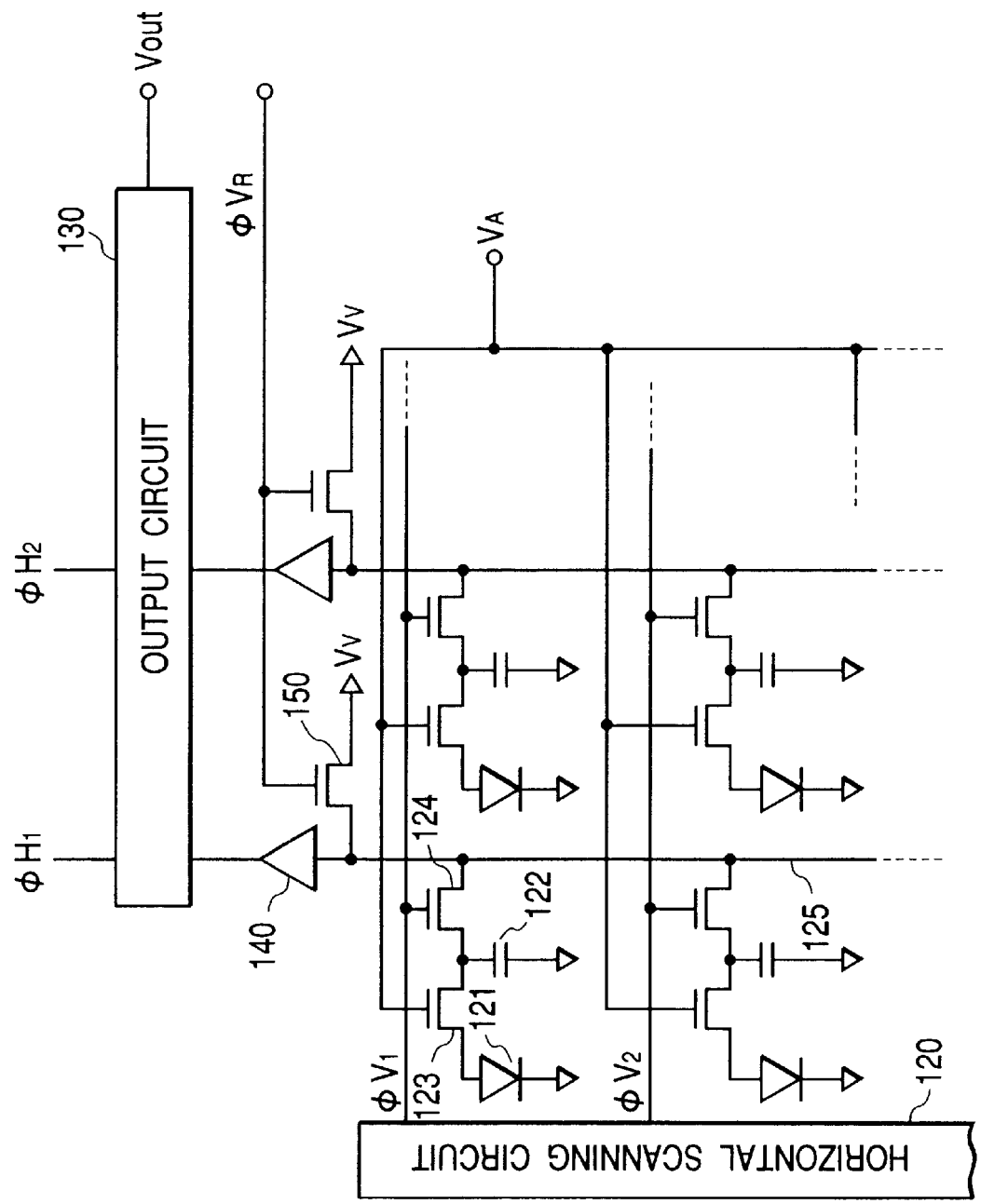
FIG. 2 is a schematically equivalent circuit diagram for explanation of an example of a radiation image pickup device in accordance with the present invention.

The transistor 2 corresponds to a transistor 124 in FIG. 2 showing the schematically equivalent circuit diagram.

Figure 23A:
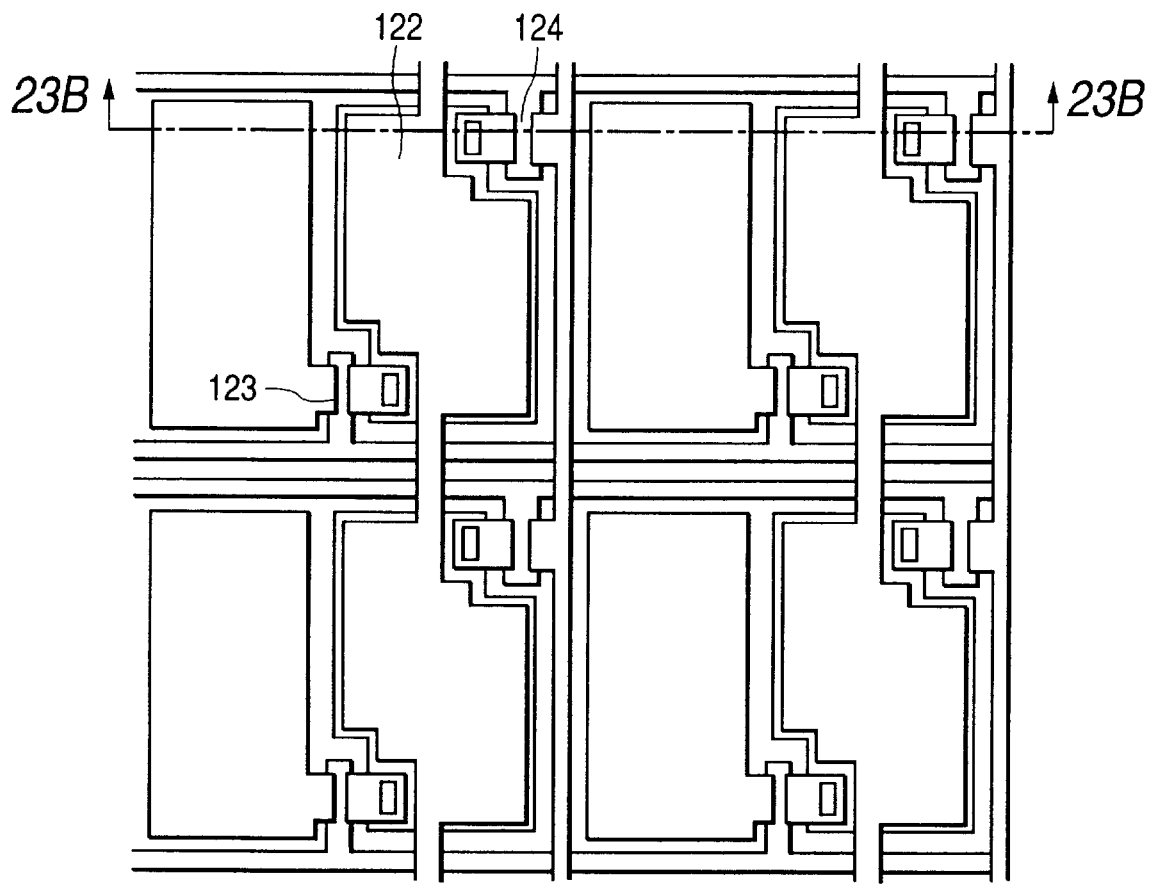
FIG. 23A is a schematically plan view showing one structural example of the radiation image pickup device.
Figure 23B:
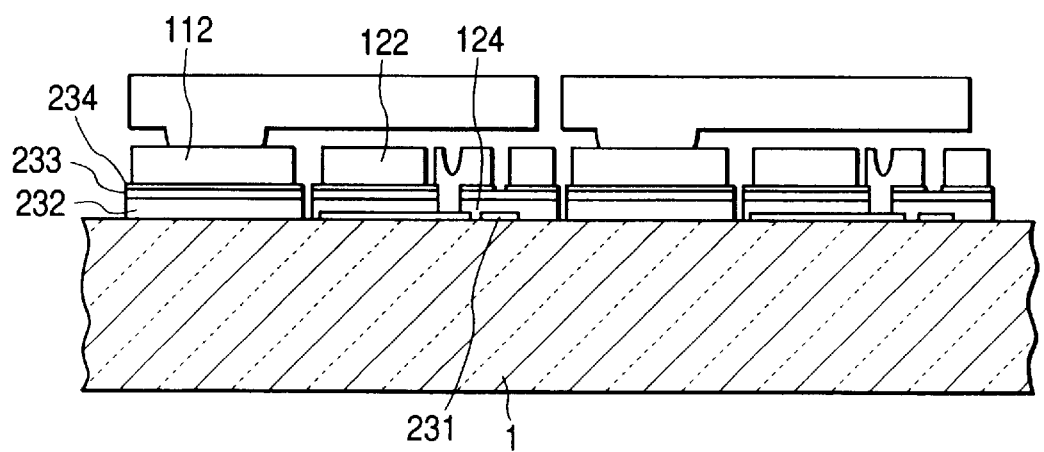
FIG. 23B is a schematically cross-sectional view taken along a line 23B—23B of FIG. 23A.

FIG. 23A is a schematically plan view showing another example of the reading portion 200, and FIG. 23B is a schematically cross-sectional view taken along a line 23B—23B of FIG. 23A. The reference numerals of the members shown in FIG. 23A will be described with reference to FIG. 2.

FIG. 2 is a schematically equivalent circuit diagram for explanation of an example of an x-ray image pickup device in accordance with the present invention. Referring to FIG. 2, a unit cell which is an input pixel includes an x-ray sensor cell 121 that functions as electric charge converting means, a storage capacity 122 that functions as electric charge storing means, a first transistor 123 that transfers a signal from the x-ray sensor cell 121 to the storage capacity 122 which functions as control means for controlling an electric field, and a second transistor 124 that reads out a signal from the storage capacity 122 which functions as reading means. As shown in FIG. 2, the unit cells thus structured are arranged at given intervals longitudinally and laterally, that is, arranged in a matrix. The first transistor 123 functions as control means for controlling an electric field applied to the x-ray sensor cell 121.

The other end of the x-ray sensor cell 121 which is not connected with the first transistor is connected with sensor potential fixing means for giving a desired potential to the other end of the x-ray sensor cell 121, and the other end of the storage capacity 122 which is not connected with the first and second transistors 123 and 124 is connected with storage potential fixing means for fixing the potential on the other end of the storage capacity 122.

The second transistor 124 in each of the unit cells is selected every row by a horizontal scanning circuit (scanning means such as a shift register) 120, and a signal is read to an output line 125 from the storage capacity 122 in each of the unit cells. The signal is inputted to an output circuit 130 through an amplifier 140 which is connected to the output line 125 and then sequentially outputted for each of columns by the output circuit 130. Each of the output lines 125 is set to a potential Vv by each of output line reset transistors 150. The output circuit 130 is made up of, for example, a storage capacity (not shown) disposed for each of the output lines, and a transistor (not shown) which connects the storage capacity and a common output line. φH1, φH2 . . . are sequentially inputted to the output circuit 130 from a scanning circuit not shown, to thereby turn on the transistor, and the signal is read to the common output line from the storage capacity for each of the columns and then outputted.

The reading portion shown in FIGS. 23A and 23B will be described. A lower electrode 231, an insulating film (silicon nitride film) 232, a high-resistive amorphous silicon 233, an n+ amorphous silicon 234 and an upper electrode 235 are formed as layers on the insulating substrate 1, such as a glass substrate, in the stated order. The thin film transistors 123 and 124 and the storage capacity 122 are fabricated with the same laminate film structure as shown in the figures. Because the same laminate film structure is used, the fabricating processes can be shortened, the manufacturing costs reduced and the manufacturing yield improved.

The metal layer 112 constitutes one of the main electrodes of the transistor 123. The metal layer 112 is electrically connected with the x-ray sensing portion 100 on an upper surface thereof. This embodiment shows an example in which the sensing portions are separated for each of the pixels.

Because the thin film transistor circuit portion made of the non-single crystal material and formed on the insulating substrate 1 is formed of a thin film, it is easy to form the thin film transistor circuit portion on the large-scaled insulating substrate. It is preferable that the circuit portion be formed of the thin film transistor for the following reasons. Because the active layer of the thin film transistor is thin (normally 0.5 μm or less), the probability of absorbing the radiation by the active layer is low, and a problem that the material is damaged by radiation that has passed through the x-ray sensing portion 100, which functions as the radiation detecting portion, hardly occurs. Also, since the radiation is hardly absorbed in the reading circuit, the occurrence of noise is reduced, and the noise characteristic is excellent.

With the laminate structure of the x-ray sensing portion 100 for the radiation and the reading circuit portion, the x-ray sensing portion has the opening ratio of 100%. Also, with the formation of only the reading circuit on the insulating substrate, because it is unnecessary to spare an area for the x-ray incident portion region, the gate width of the thin film transistor can be sufficiently ensured, and the highspeed operation of the thin film transistor can be achieved. Although depending on the characteristic of the formed semiconductor and the number of pixels, the reading of information of 30 FPS (image reading of 30 times per one second: frame/second) to 60 FPS can be sufficiently achieved.

Figure 3A:
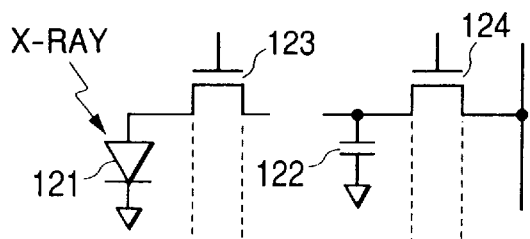
FIG. 3A is an equivalent circuit diagram for explanation of an example of a unit cell of the radiation image pickup device.
Figure 3B:
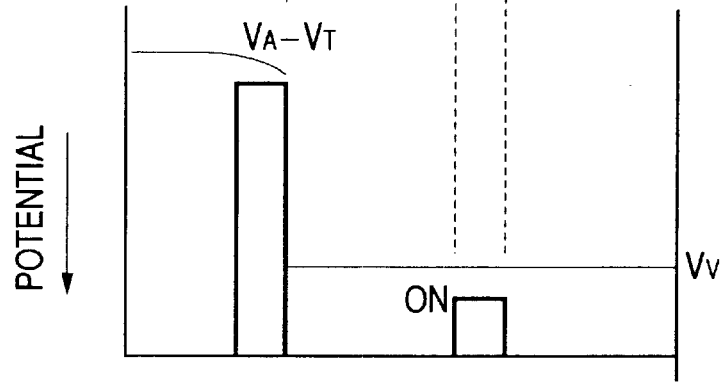
FIGS. 3B, 3C and 3D are potential diagrams for explanation of an example of the operation of the unit cell shown in FIG. 3A.
Figure 3C:
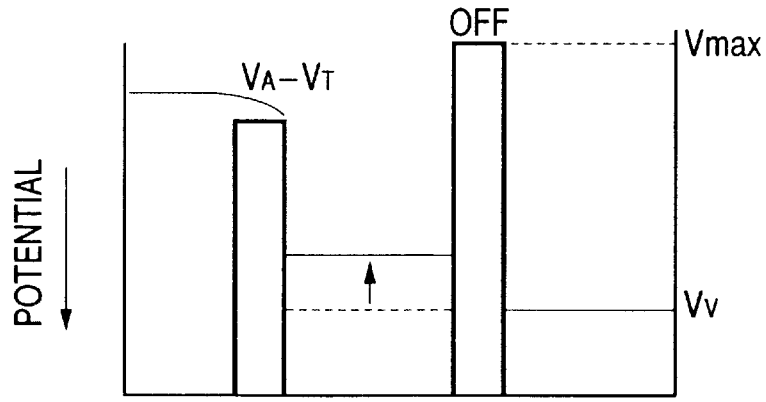
Figure 3D:
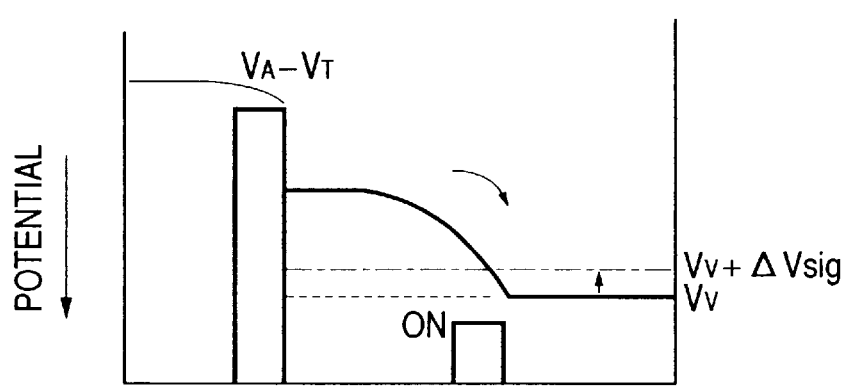

FIG. 3A is an equivalent circuit showing the unit cell, and FIGS. 3B to 3D are schematic potential diagrams for explanation of an example of the operation of the unit cell of the above x-ray image pickup device. In FIGS. 3B to 3D, the axis of abscissa represents locations on the unit cell, and the axis of ordinate represents potentials on the respective locations.

FIG. 3B shows a potential diagram showing a sensor reset state. Upon turning on the transistor 124 and the output line reset transistor 150 shown in FIG. 2, the potential of the storage capacity 122 becomes a reset voltage VV as shown in FIG. 3B. When a given voltage VA is kept to be given to the gate of the transistor 123, the transistor 123 always becomes the potential of VA-VT (symbol VT is a threshold voltage of the transistor 123).

FIG. 3C is a potential diagram showing a signal storing state. When x-rays are irradiated onto the sensor cell 121 in a state where the transistor 124 is off, carriers are produced in the sensor cell 121, the carriers are stored in the storage capacity 122 through the transistor 123, and the potential of the storage capacity 122 changes from the potential Vv.

FIG. 3D is a potential diagram showing a reading state. When the transistor 124 turns on in a state where the output line reset transistor 150 is off, charges stored in the storage capacity 122 are read by the output line 125.

In principle, the above-described sensor resetting, signal storing operation and reading operation are repeated.

Figure 4:
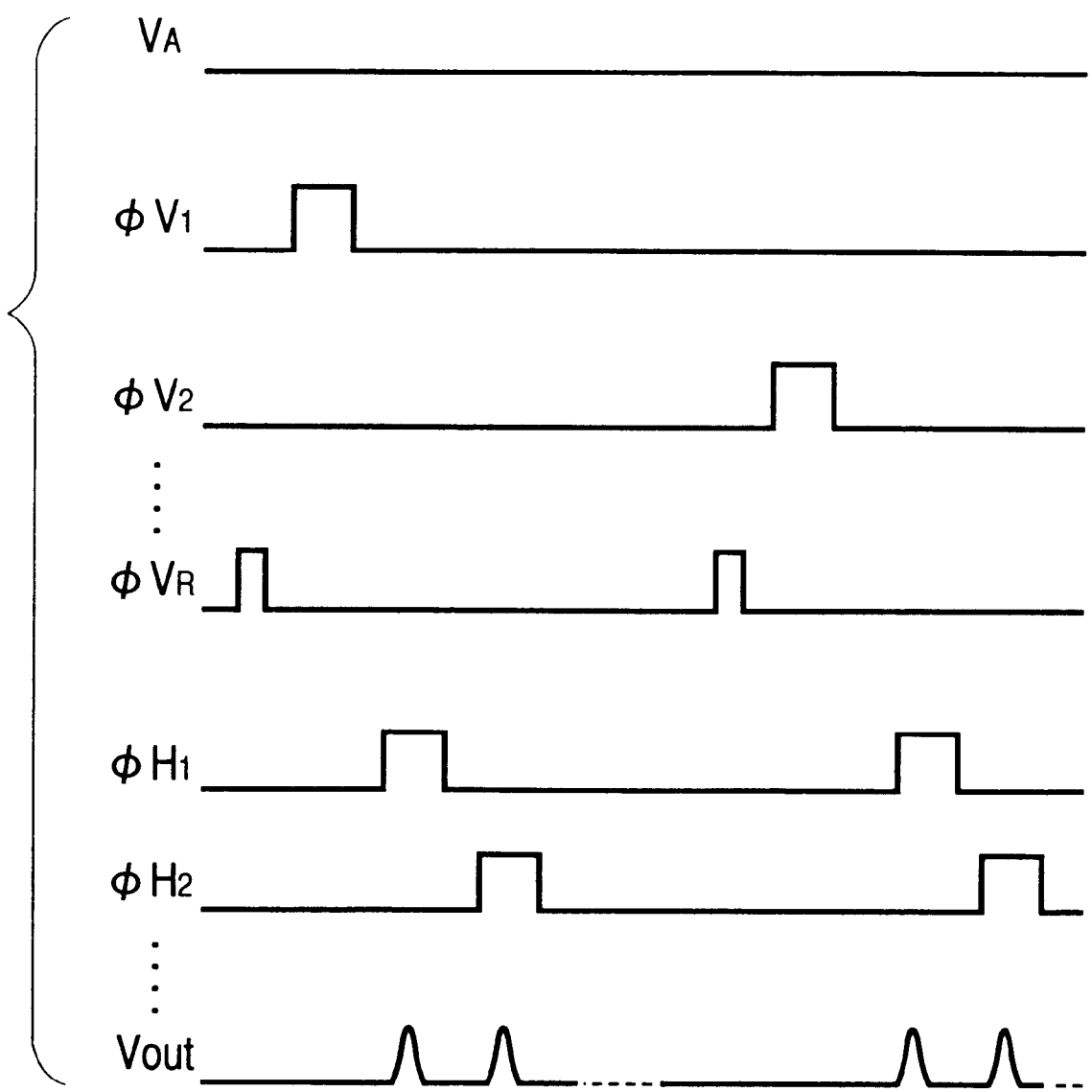
FIG. 4 is a timing chart for explanation of an example of the operation of the radiation image pickup device.

FIG. 4 is a timing chart for explanation of an example of the driving operation of the x-ray image pickup device.

It is assumed that a voltage given to the gate of the transistor 123 is a given voltage (voltage VA). After the reset (reset potential Vv) of the output line 125 has been conducted by turning on the output line reset transistor 150 with φVR as VR, a pulse is added to φV1 by the horizontal scanning circuit 120, the signals stored in the storage capacity 122 are read to the respective output lines 125, and the respective horizontal scanning operations are conducted as φH1, φH2, . . . , to thereby sequentially output signals from the output circuit 130 (Vout).

Figure 5:
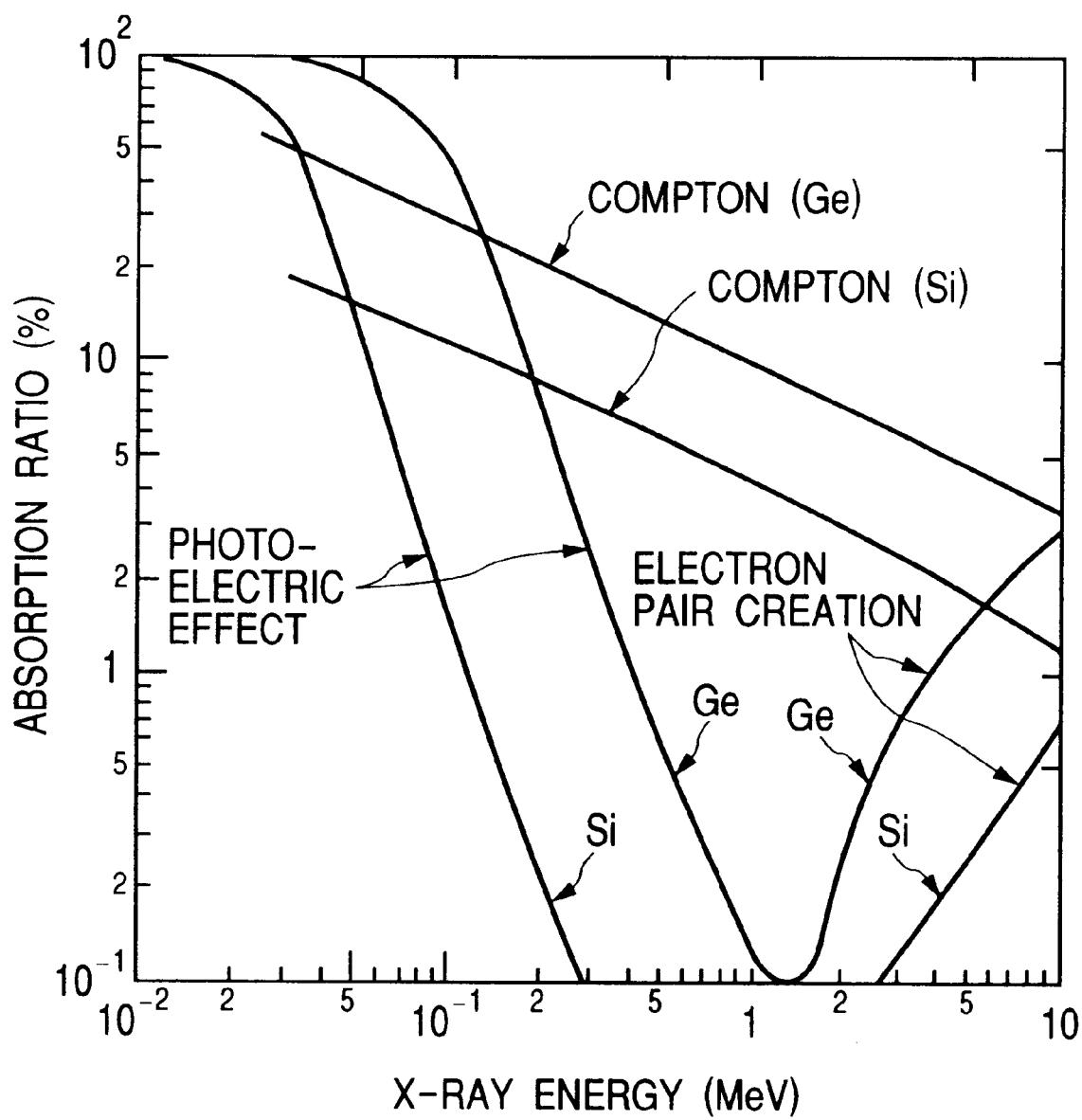
FIG. 5 is a characteristic graph for explanation of an example of the x-ray energies and the absorption ratios of Si and Ge, measured by a Ge and Si detector (thickness of 0.3 cm).

The absorption of x-rays by the semiconductor material of the x-ray sensor shown in FIG. 1 is determined by three mechanisms consisting of the photoelectric effect, Compton and electron pair creation. FIG. 5 shows examples of Si and Ge.

In the medical and analytical applications of the radiation image pickup device, since there are many cases in which the semiconductor material of 0.1 MeV or less in band gap is used, the absorption is mainly determined by the photoelectric effect.

The absorption coefficient of the x-rays becomes larger as the atomic number of the material is larger. In the case where detection is made by the p-n junction of the semiconductor, since a dark current increases even at a room temperature and the noise characteristic is deteriorated, the countermeasure to such a problem becomes necessary. As a result, a material 1 eV or more in band gap, small in dark current and large in x-ray absorption is desirable. GaAs, GaP and so on are preferable as the radiation detecting material since they are larger in band gap than Si.

As shown in FIG. 5, the x-ray absorption coefficient of Si is relatively small. In view of this, Si may be used as a material for low energy.

Figure 6:
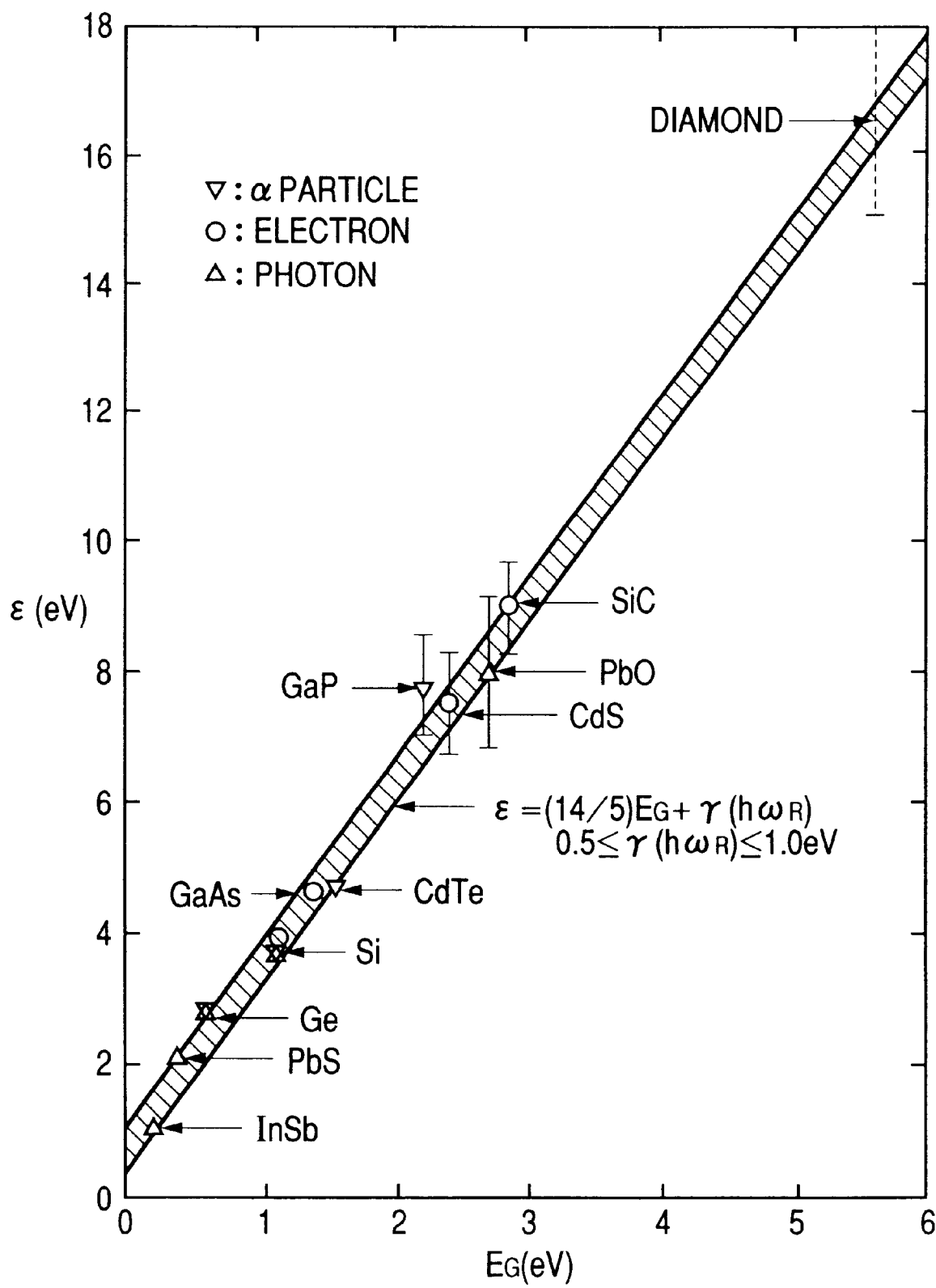
FIG. 6 is a characteristic graph for explanation of an example of an energy necessary for producing carriers due to the radiation of a semiconductor material.

FIG. 6 shows an energy necessary for producing carriers due to the radiation of a semiconductor material. The axis of abscissa represents semiconductor energy gap, and the axis of ordinate represents energy necessary for the production. The smaller energy necessary for producing carriers is more desirable because a large number of carriers can be produced.

The band gaps of GaAs and CdTe are about 5 Ev, respectively. Therefore, for example, 10000 pairs of carriers may be produced from an x-ray of 50 keV. GaAs and CdTe are large in band gap, small in ε (Ev), and large in x-ray absorption so that they are preferable as the radiation detecting material.

In addition, GaAs is desirable as the applied material since the perfectivity of crystal is high and the dark current is small. GaAs has x-ray absorbing characteristics considerably close to that of Ge. In view of the above characteristic, GaAs can be preferably employed for medical applications where the quantity of irradiated x-rays is limited. The mass-productivity of GaAs is currently excellent, similar to Si, thus making it very economical.

Figure 7:
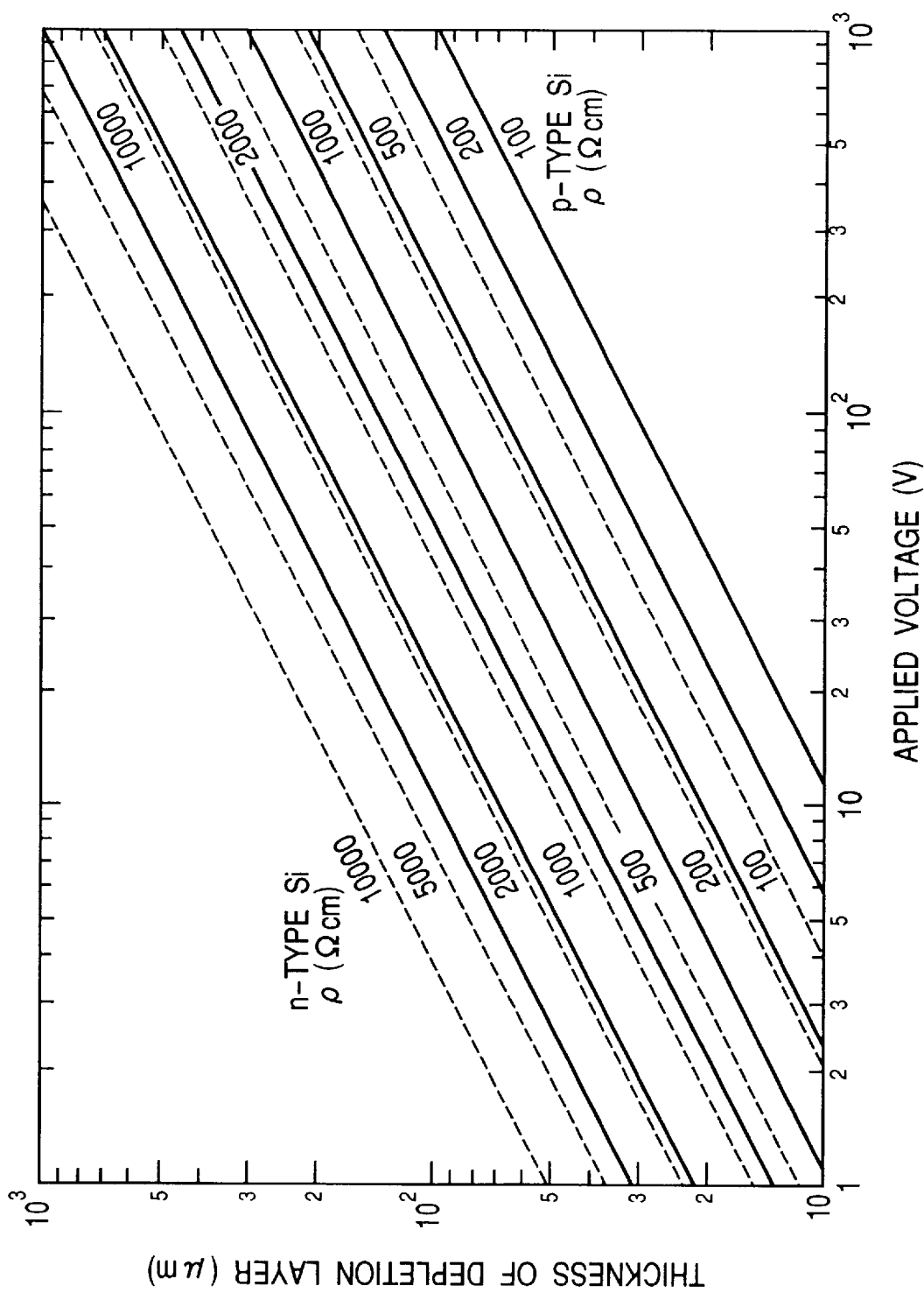
FIG. 7 is a characteristic graph for explanation of an example of a relationship between an applied voltage and the thickness of a depletion layer with the resistivity of an $n^+$-type region or a p-type region in Si as a parameter.
Figure 8:
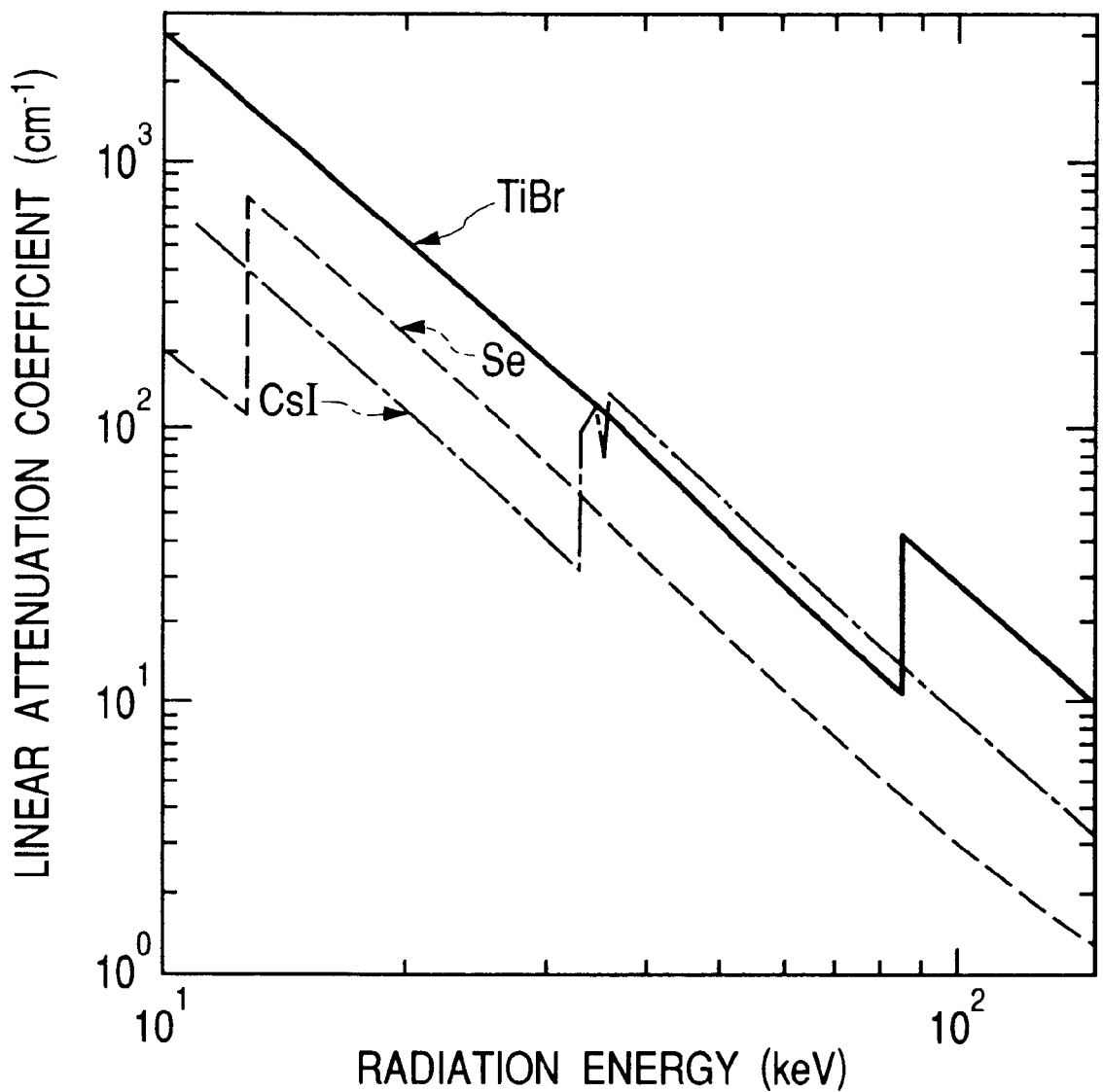
FIG. 8 is a graph for showing an example of the x-ray absorbing characteristics of TiBr, CsI and Se.

In the x-ray sensor shown in FIG. 1, the $n^+$ layer 30 and $p^+$ layer 10 on a portion that detects the x-rays (x-ray sensing portion 100) become insensitive bands of the radiation (x-rays in this example). The conversion of the x-rays into carriers is effectively conducted in the depletion layer. FIG. 7 shows the applied voltage and the thickness of the depletion layer with $n^+$ or p resistivity of Si as a parameter. It is preferable that the resistivity is 100 Ωcm or more and the applied voltage is 10 V or higher, preferably 100 V or higher. The applied voltage of 1000 V or higher is demanded to provide the depletion layer close to 1 mm in thickness. Since a wafer of $10^7$ Ωcm or more in resistance can be made of GaAs, a thicker depletion layer is obtained with a lower voltage as compared with Si, thereby being capable of making the sensitivity high. Also, since GaAs has the same x-ray absorbing characteristic as that of Ge, it is preferable directly as the x-ray material. In FIG. 2, a voltage of 1000 V or higher is applied to a terminal 1000 in case of Si. The voltage becomes lower in case of GaAs.

Since the given voltage VA is always applied to the transistor (thin film transistor: TFT) 123, another electrode of the sensor cell 121 always becomes VA-VT. For that reason, a given voltage is always applied to the sensor cell 121 without any change of the depletion layer in thickness, thereby being capable of conducting stable operation.

FIG. 24 shows an example in which single crystal semiconductor material is used as the high-resistive x-ray detecting portion. The material of the single crystal high resistant portion 20' is preferably GaAs, since the resistance is high (>$10^7$ Ωcm), the dark current (band gap is 1.5 Ev) is small and a large-diameter wafer (6 inches φ) can be produced. Reference numeral 10' denotes an $n^+$ layer.

Figure 9:
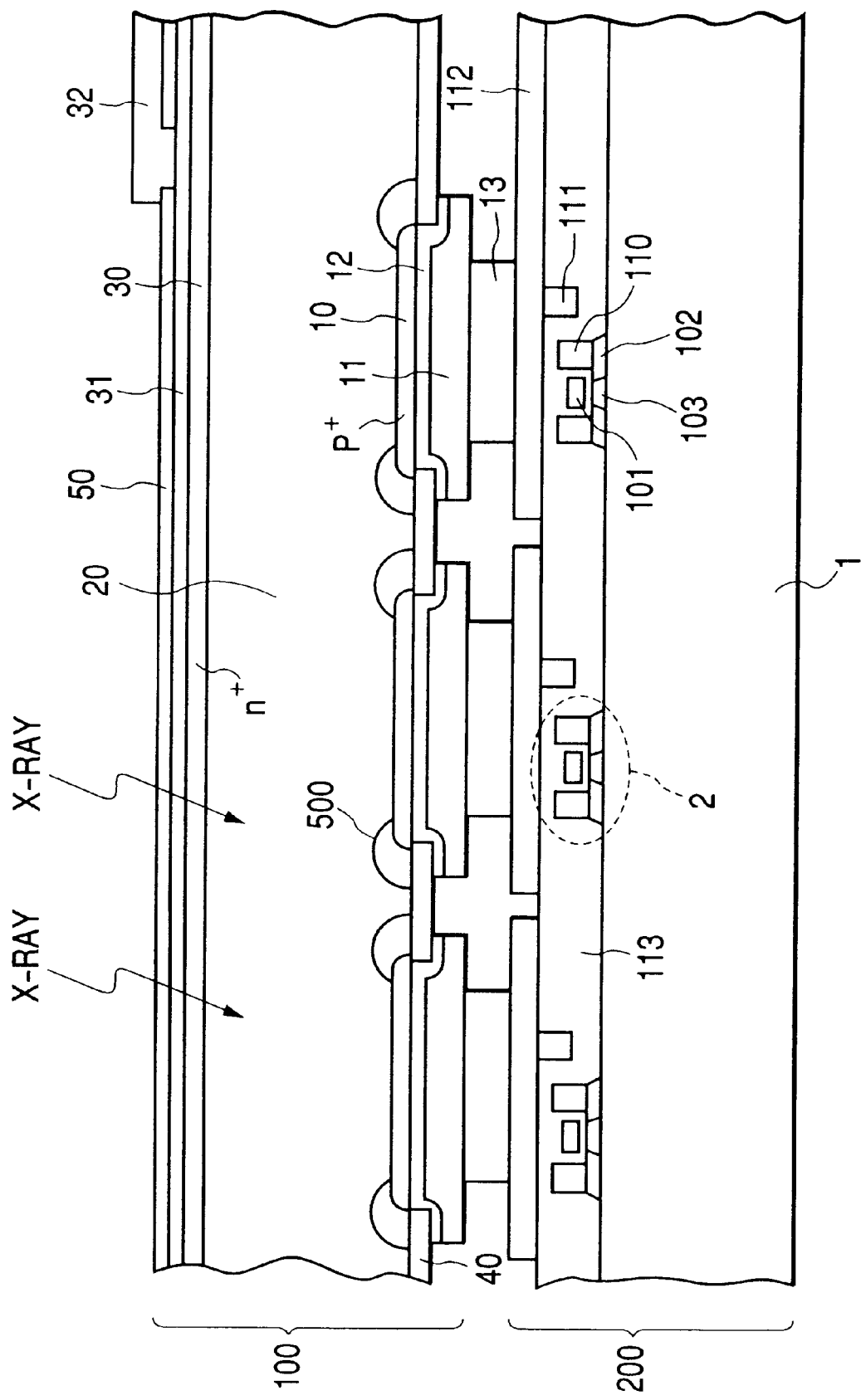
FIG. 9 is a schematically cross-sectional view showing an x-ray sensor for explanation of another example of a radiation image pickup device in accordance with the present invention.

FIG. 9 is a cross-sectional view showing an x-ray sensor in accordance with another embodiment of the present invention.

In this embodiment, a p region 500 (which forms a guard region) lower in density than $p^+$ of a $p^+$ layer 10 is disposed in the periphery of the $p^+$ layer 10. With this arrangement, the peripheral rapid electric field is relaxed in the case where a high voltage is applied to the x-ray detector, to thereby improve the withstand voltage of the p-n junctions.

Figure 10:
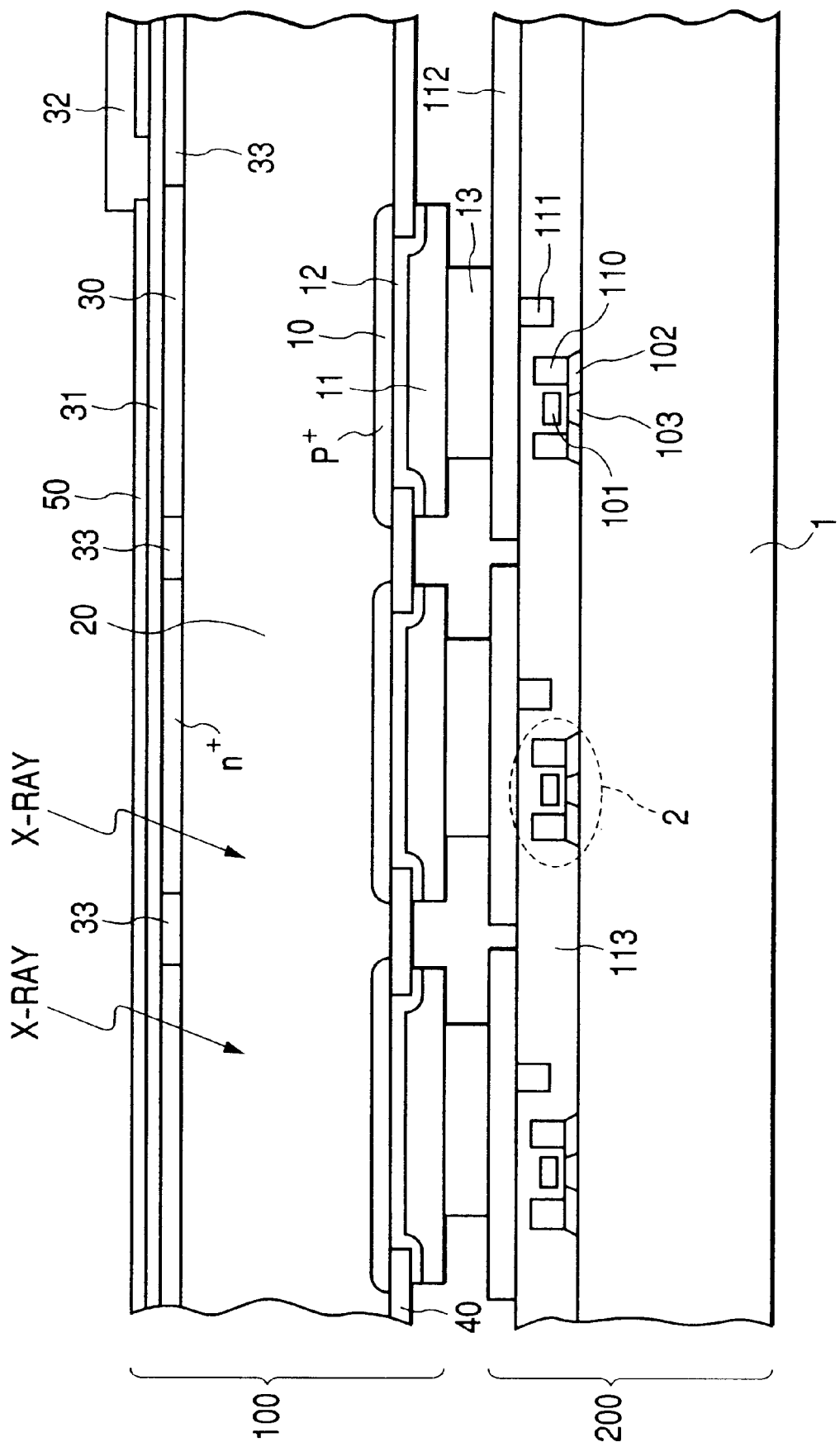
FIG. 10 is a schematically cross-sectional view showing an x-ray sensor for explanation of another example of a radiation image pickup device in accordance with the present invention.

FIG. 10 is a cross-sectional view showing an x-ray sensor in accordance with still another embodiment of the present invention.

In this embodiment, the upper $n^+$ region 30 is separated which is effective in an improvement of the resolution. Reference numeral 33 denotes an insulating film that separates the $n^+$ region 30.

Figure 11:
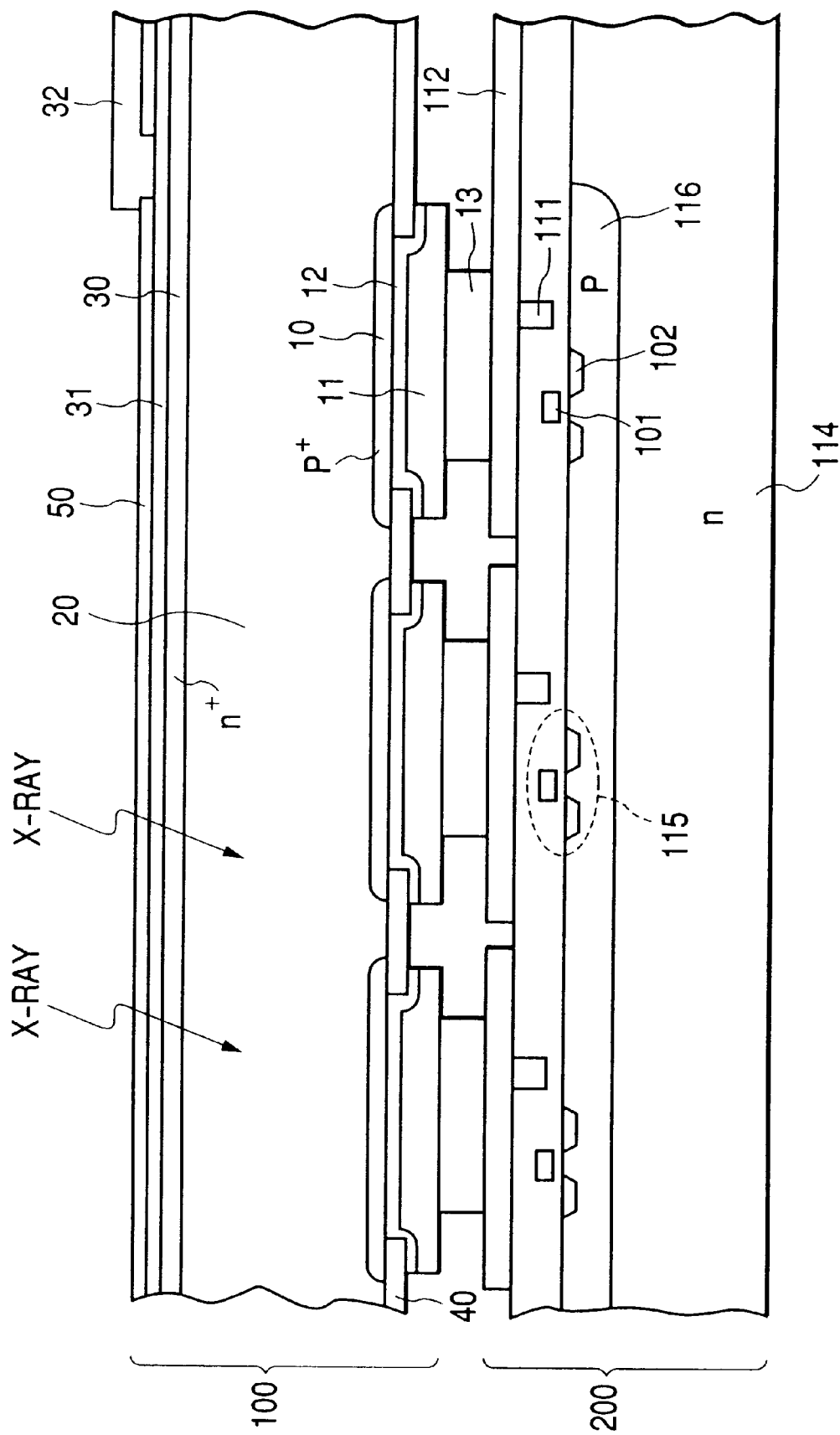
FIG. 11 is a schematically cross-sectional view showing an x-ray sensor for explanation of another example of a radiation image pickup device in accordance with the present invention.

FIG. 11 is a schematically cross-sectional view showing an x-ray sensor in accordance with yet still another embodiment of the present invention.

FIG. 11 shows an example such that a single crystal substrate is employed as the lower substrate. A single crystal substrate 114 is employed so as to dispose peripheral circuits on the lower substrate, thereby exhibiting the more effects of making the function higher and high-speed reading operation. The source and drain 102 which are n-type regions are formed within the single crystal substrate 114 which is a semiconductor substrate, and a gate electrode is formed on the p region 116 through the insulating layer, to thereby form a transistor 115.

Figure 12:
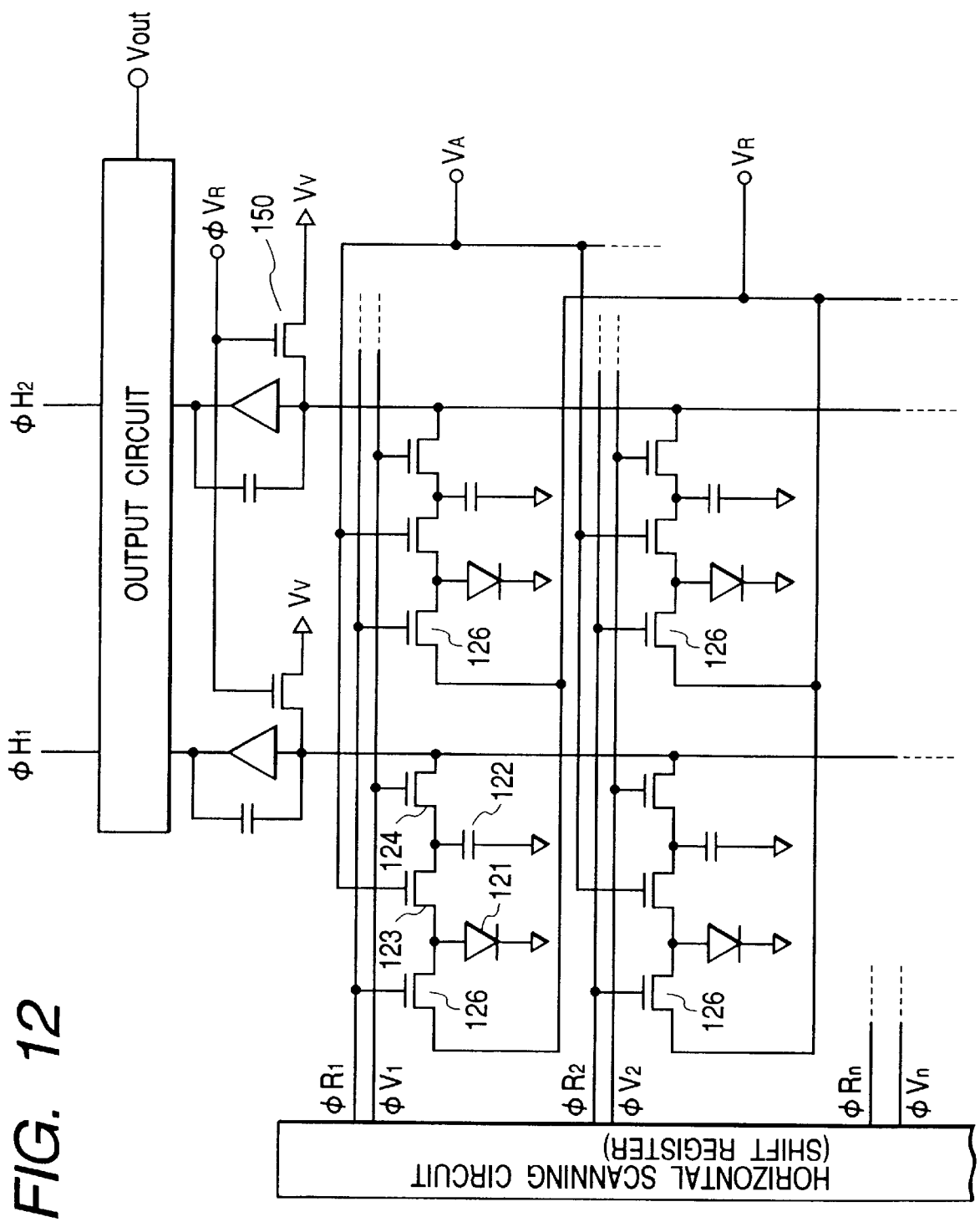
FIG. 12 is a schematically equivalent circuit diagram for explanation of another example of a radiation image pickup device in accordance with the present invention.

FIG. 12 shows an equivalent circuit of an x-ray image pickup device in accordance with another embodiment of the present invention. In this embodiment, a reset transistor 126 is connected to the sensor cell 121. The provision of the reset transistor (reset thin film transistor) 126 enables the residual image of the sensor to be improved. The voltage VRS is so set as to be slightly larger than VA-VT, to thereby provide an x-ray sensor improved in the residual image. The reset transistor 126 functions as potential fixing means for fixing the potential of the sensor cell 121 for a given period of time.

Figure 22:
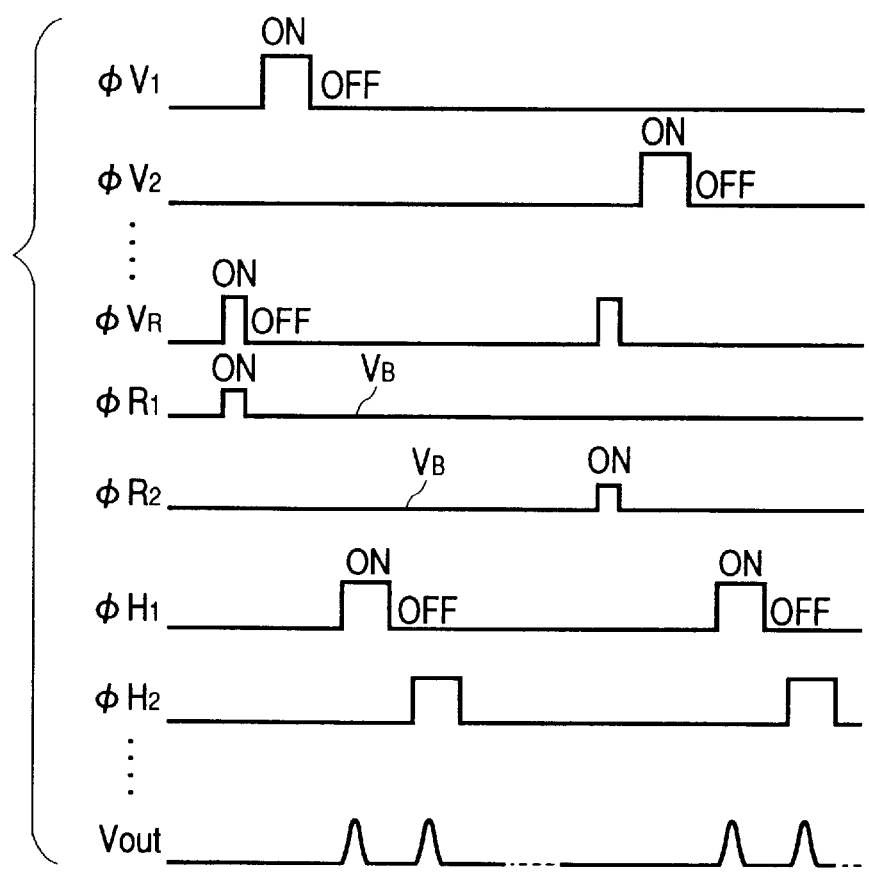
FIG. 22 is a timing chart for explanation of an example of the operation of the radiation image pickup device.

FIG. 22 is a timing chart of the operation of the above x-ray image pickup device.

φR1, φR2, ..., φV1, φV2, ... are synchronized with φVR, respectively, to reset the sensor portion. If the voltage of VB is applied to the gate of the reset transistor 126 without the complete off-state of φR1 and φR2 when φR1 and φR2 turn off, and intense input x-rays are inputted to the sensor portion. Then, when large electric charges $Q_{Large}$ are stored in the storage capacity 122 (capacitance $C_1$), $V_{Large}=Q_{Large}/C_1$ is not larger than $V_B-V_{TH}$. As a result, an excessive voltage can be prevented from being applied to the switching transistor 124. The excessive voltage is, for example, a voltage larger than Vmax of the transistor 124 shown in FIG. 3C, and when the voltage of Vmax or higher is stored in the storage capacity C (122), the carriers flow to the output side of the transistor 124, to thereby have great influence on an image. Thus, influence on the image which is called "blooming" by CCD can be eliminated.

Figure 13:
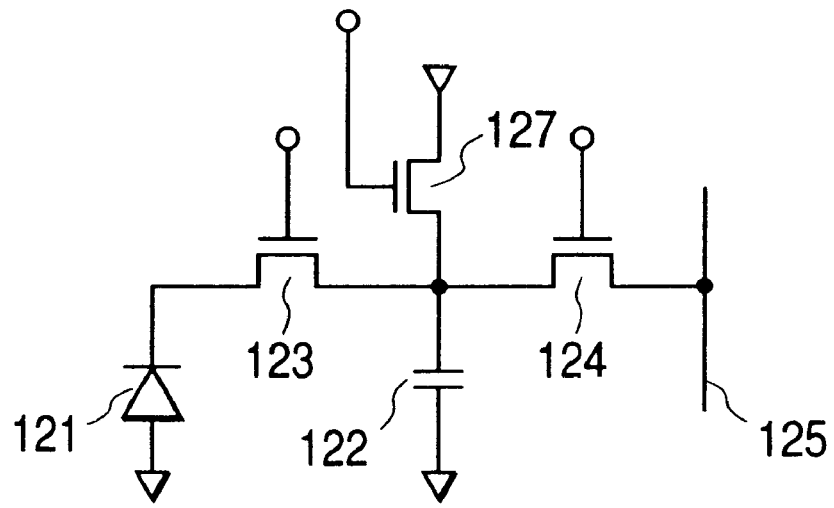
FIGS. 13 and 14 are equivalent circuit diagrams for explanation of an example of a unit cell in accordance with the present invention.

FIG. 13 is a diagram showing an example in which the reset switch 127 that resets the storage capacity is disposed in each of the storage capacities.

When the operation of the switching transistor 127 is the same as that of the transistor 126 in the sensor shown in FIG. 12, if the voltage of VB is applied to the gate of the switching transistor 127 in an off-state similarly, the storage capacity 122 (capacitance C1) can be prevented from becoming a voltage of VB-VTH or higher. The overflow of the carriers in the storage capacity 122 from the read transistor 124 is prevented, thereby being capable of improving the characteristic of a longitudinal image.

If the amount of x-rays is sufficiently small, the voltage in the off-state may be a complete off-state potential.

The above function can bring a protective function when the excessive x-rays are inputted to the device. The switching transistor 127 can provide two functions of the reset switch and the protecting circuit for preventing the carrier overflow.

Figure 14:
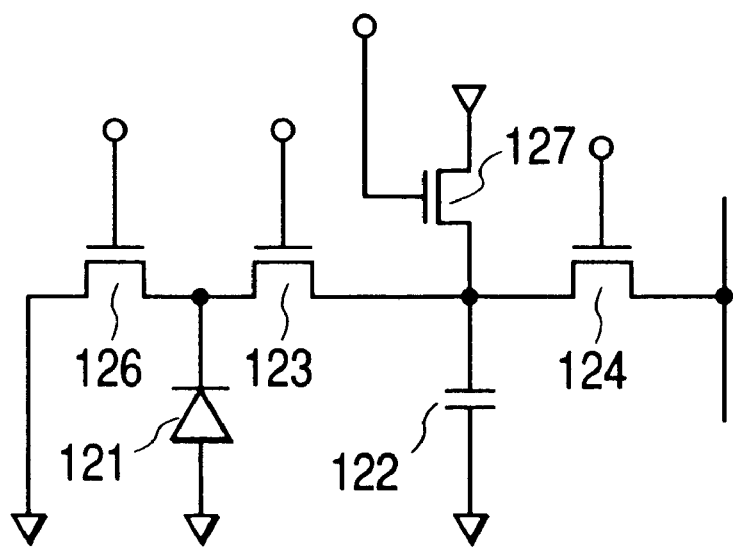

FIG. 14 is a diagram for explanation of an embodiment in which the transistors 126 and 127 are disposed together.

If $V_B$ is set to be slightly larger than or equal to $V_A$ (($V_A-V_{TH126}$)≃($V_B-V_{TH128}$)), the maximum storage charges in the sensor is $Q_{max}=(V_A-V_{TH26}-V_V) C_1$.

$Q_{max}$ can be readily changed with a change in $V_A$, $V_B$ and $V_R$. Also, if $V_B$ is set by a smaller one of the source-gate withstand voltage ($V_S-G_{max}$) of the switching transistor 124 and the withstand voltage ($V_S-D_{max}$) between the source and the drain thereof, the voltage breakdown of the switching transistor can be protected.

Figure 15:
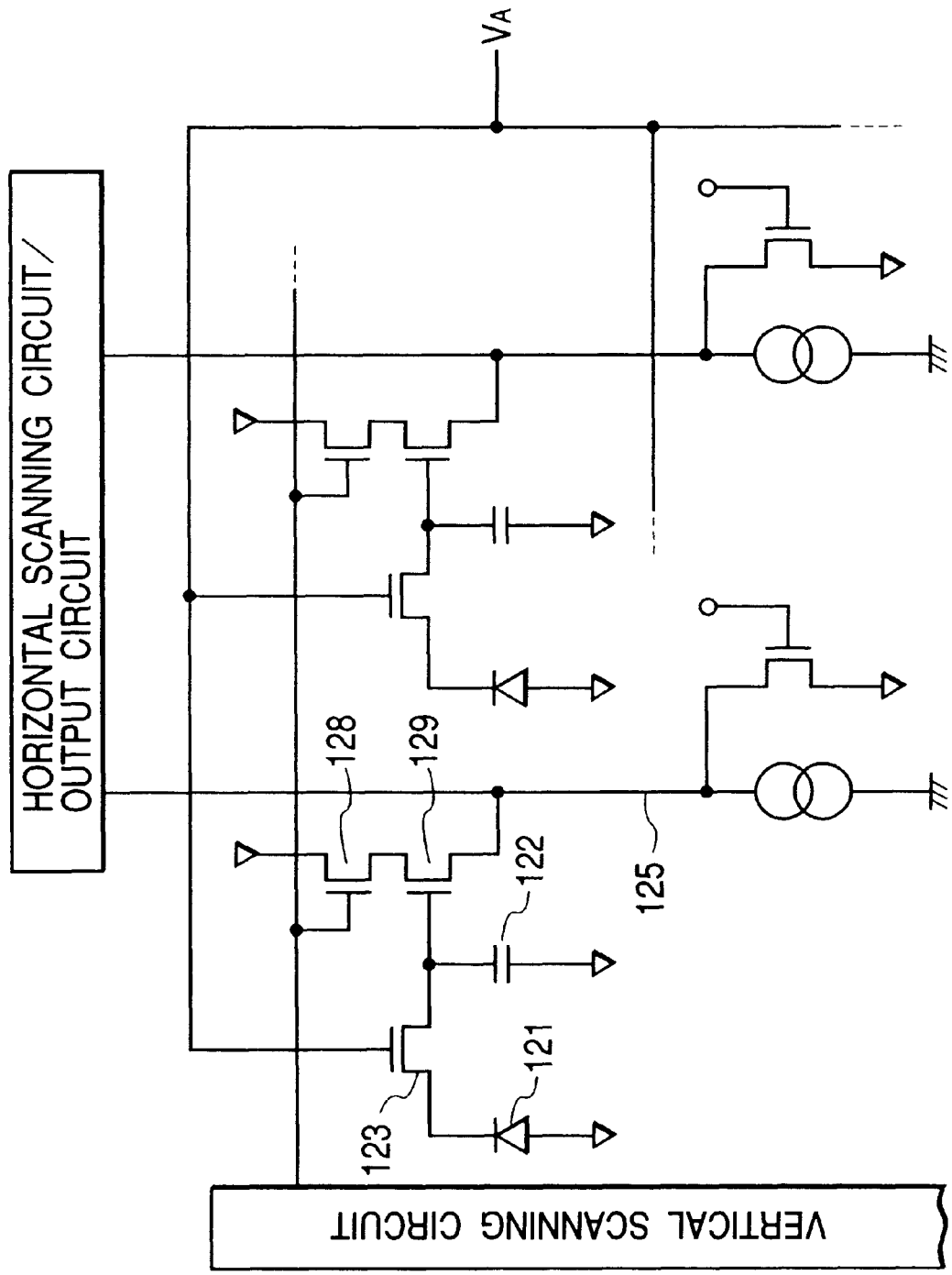
FIG. 15 is a schematically equivalent circuit diagram for explanation of another example of a radiation image pickup device in accordance with the present invention.

In FIG. 15, because a source follower is provided for each of the cells, that is, an amplifier is provided for each of the cells, a signal can be amplified so that the sensitivity can be improved. Each of the cells has a transistor 128 for selection and a transistor 129 for amplification to constitute the source follower.

Figure 16:
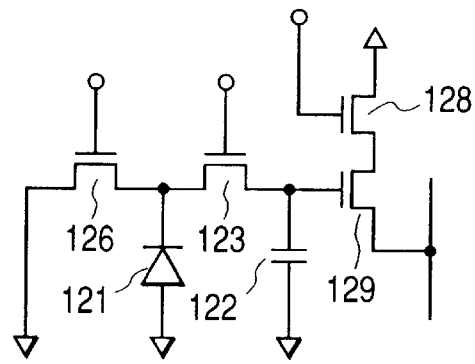
FIGS. 16, 17 and 18 are equivalent circuit diagrams for explanation of another example of a unit cell in accordance with the present invention.
Figure 17:
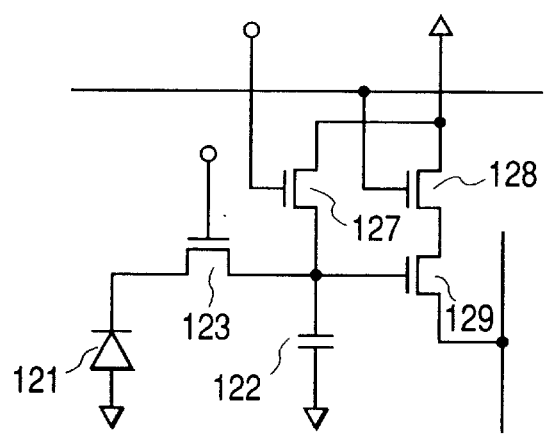
Figure 18:
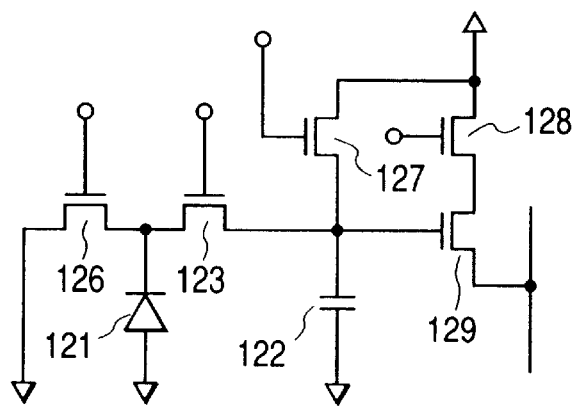

FIGS. 16 and 18 show the unit cells structured as shown in FIGS. 12 and 14, with the source follower shown in FIG. 15. In FIGS. 16 and 18, the reset transistor 126 is disposed, respectively, to thereby improve a residual image.

Figure 19:
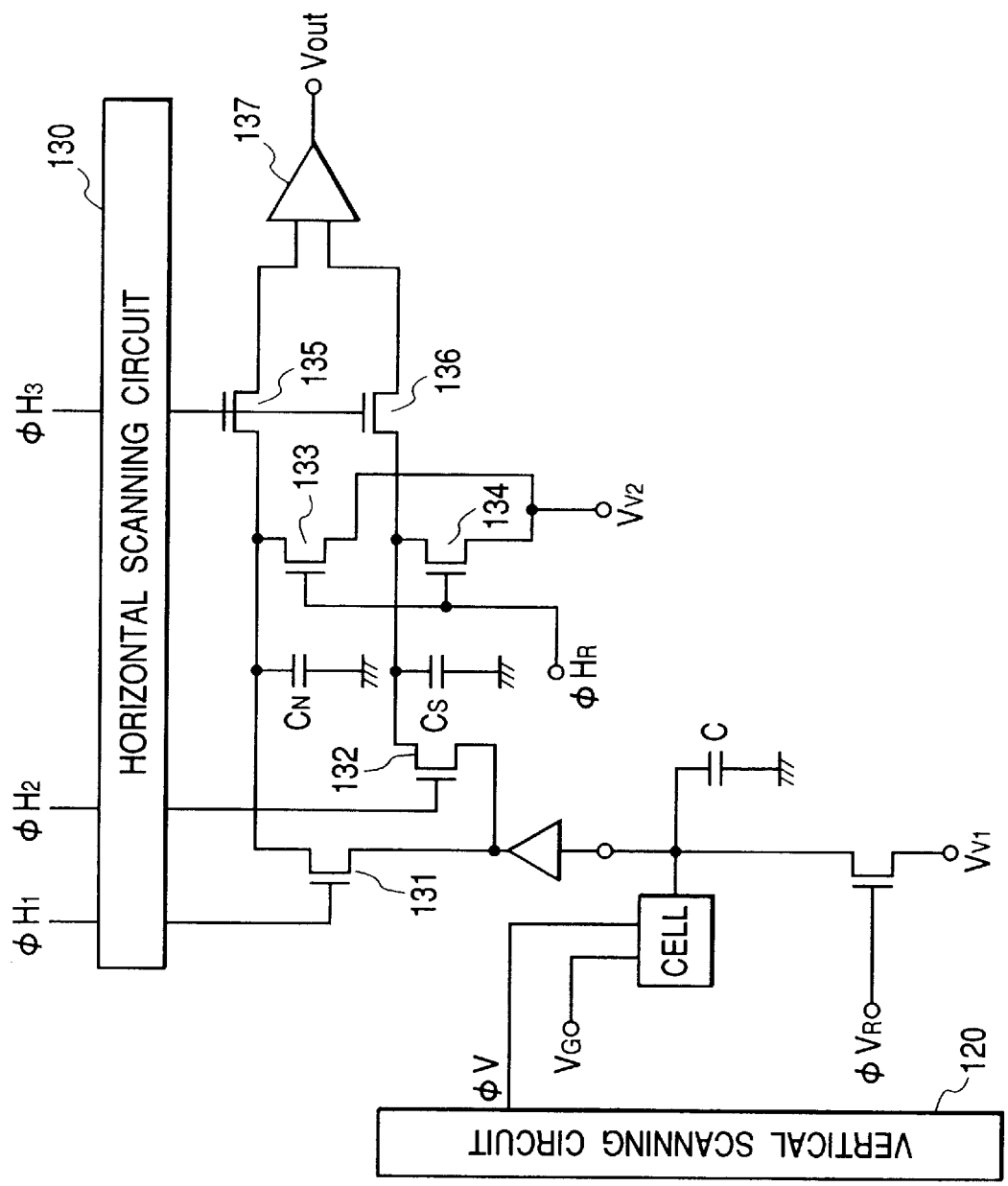
FIG. 19 is a schematically equivalent circuit diagram for explanation of another example of a radiation image pickup device in accordance with the present invention.

FIG. 19 shows an embodiment in which two output systems are disposed in order to remove a fixed pattern. In FIG. 19, noises after the sensor has been reset are read from each cell and then stored in the storage capacity $C_N$ through a transistor 131. Then, a signal including the noise component is read from the cell through the transistor 132 and then stored in the storage capacity $C_S$. Thereafter, the noises and the signal including the noise component are read from both of the storage capacities $C_N$ and $C_S$, and the noise component is subtracted from the signal including the noise component and then outputted by a subtracting amplifier 137 (Vout). Reference numeral 133 and 134 denote transistors that reset the storage capacities $C_N$ and $C_S$.

Subsequently, an example of another x-ray image pickup device in accordance with the present invention will be described below.

Figure 25:
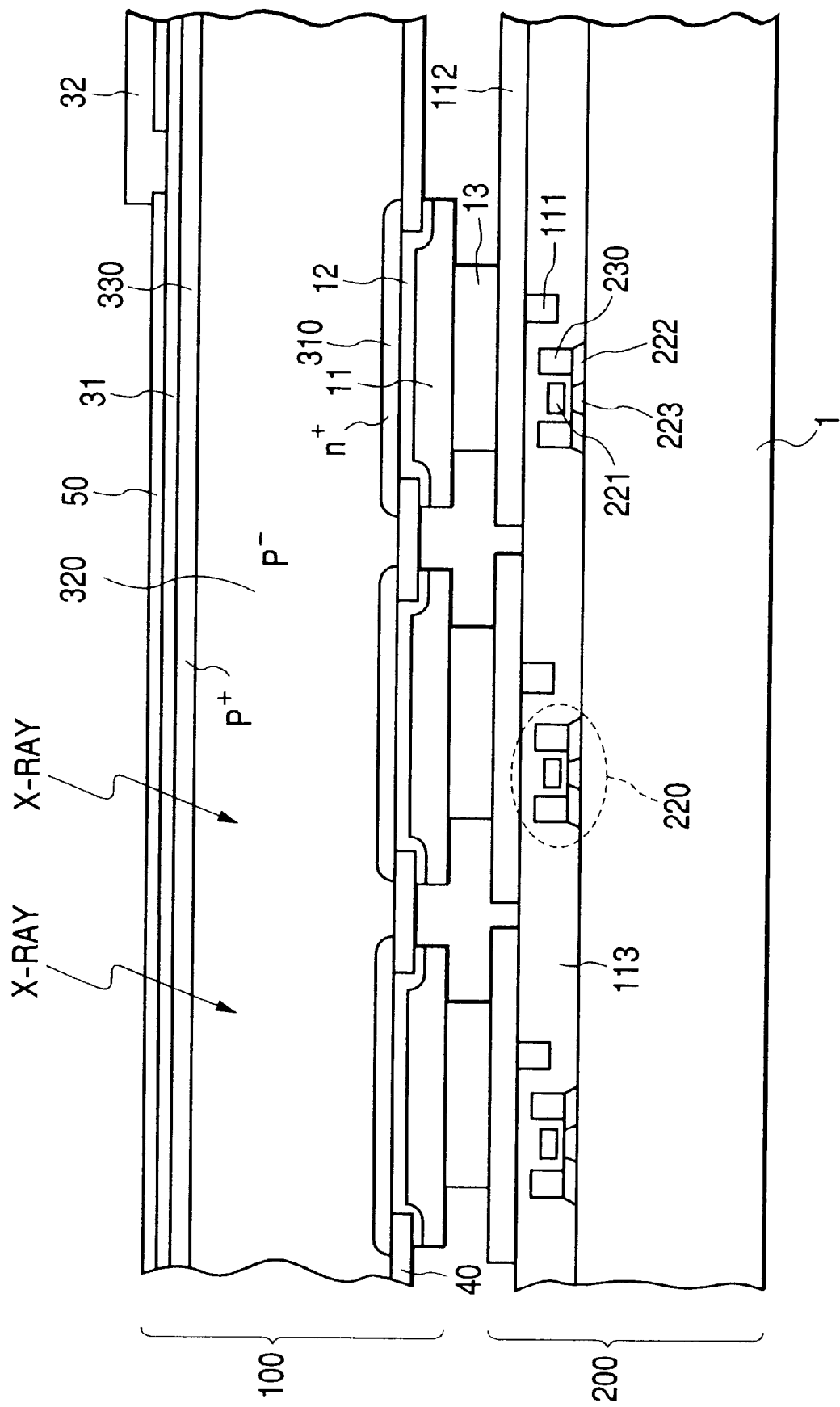
FIG. 25 is a schematically cross-sectional view showing an x-ray sensor for explanation of another example of a radiation image pickup device in accordance with the present invention.

FIG. 25 is a schematically cross-sectional view showing an x-ray sensor in accordance with the present invention. In FIG. 25, elements having the same reference numerals as those in FIG. 1 are identical with those described with reference to FIG. 1, and therefore, their details will be omitted. The x-ray sensor shown in FIG. 25 produces pairs of electrons and positive holes from x-rays irradiated onto the sensing portion 100, stores either the carriers of the electrons or the positive holes, and reads the carriers as an electric signal representative of image information, as described with reference to FIG. 1.

The x-ray sensing portion 100 is made of semiconductor material such as GaAs, GaP or Si as described above, and includes an n$^+$ layer 310, a p$^-$ layer (i layer) 320 and p$^+$ layer 330. Those layers form a p-i-n diode where a depletion layer extends from an interface of the n$^+$ layer 310 and the p$^-$ layer (i layer) 320. Metal layers 31 and 32 are formed on the p$^+$ layer 330, that is, the x-ray incident side, and metal layers 11 and 12 are formed under the n$^+$ layer 310, that is, on an opposite side of the x-ray incident side, in this example, on the reading portion 200 side. The metal layer 12 is made of a barrier metal as described above. The x-ray sensing portion 100 may be formed by using the single crystal semiconductor substrate. As shown in the figure, this example is different from the example shown in FIGS. 1 and 2 in the connecting direction of the diode in the x-ray sensing portion 100.

The reading portion 200 includes an n-type thin film transistor 220 that constitutes a circuit on the insulating substrate 1, and the n-type thin film transistor 220 includes a gate 221, an n$^+$ source, an n$^+$ drain 222, a semiconductor active layer 223 of the low impurity density, and a metal wiring 230 connected with its source and its drain. The thin film transistor 220 is covered with the protective film 113. The preferred semiconductor material of the thin film transistor may be non-single crystal material such as amorphous silicon, polysilicon or microcrystal silicon. Like FIG. 1, although being not shown in FIG. 25, the reading portion 200 is formed with a capacitance that forms a storage capacity.

Figure 26:
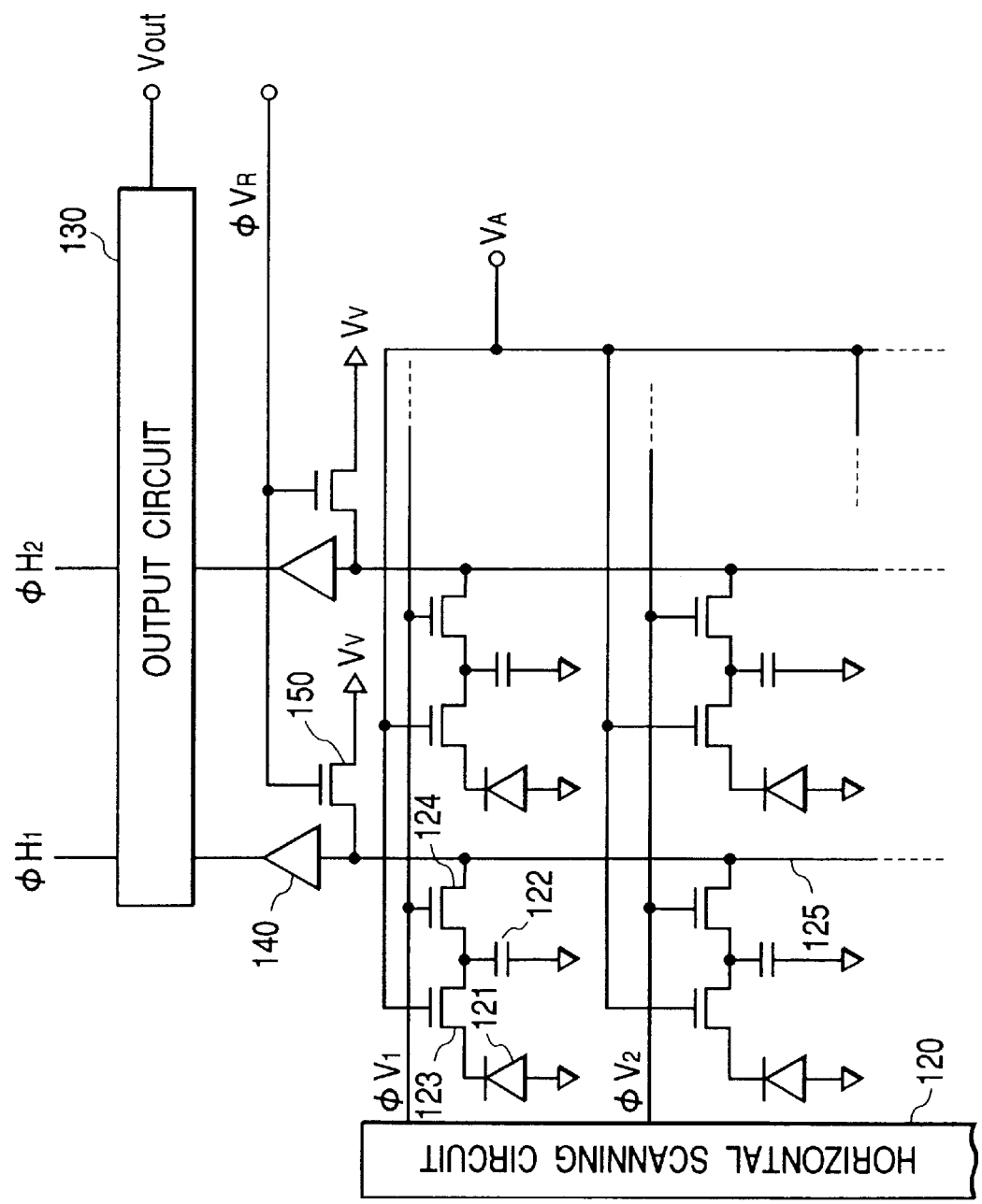
FIG. 26 is a schematically equivalent circuit diagram for explanation of another example of a radiation image pickup device in accordance with the present invention.

FIG. 26 is a schematically equivalent circuit diagram showing an x-ray image pickup device having the x-ray sensor shown in FIG. 25. Elements having the same reference numerals as those in FIG. 2 are identical with those described with reference to FIG. 2, and therefore their details will be omitted. In FIG. 26, the unit cell includes an x-ray sensor cell 121, a storage capacity 122, a first n-type thin film transistor (TFT) 123 that transfers a signal from the x-ray sensor cell 121 to the storage capacity 122, and a second n-type thin film transistor 124 that reads a signal from the storage capacity 122. In FIG. 26, the polarity of the x-ray sensor cell 121 shown as a diode in the figure is different from the polarity of the equivalent circuit diagram shown in FIG. 2.

Figure 35:
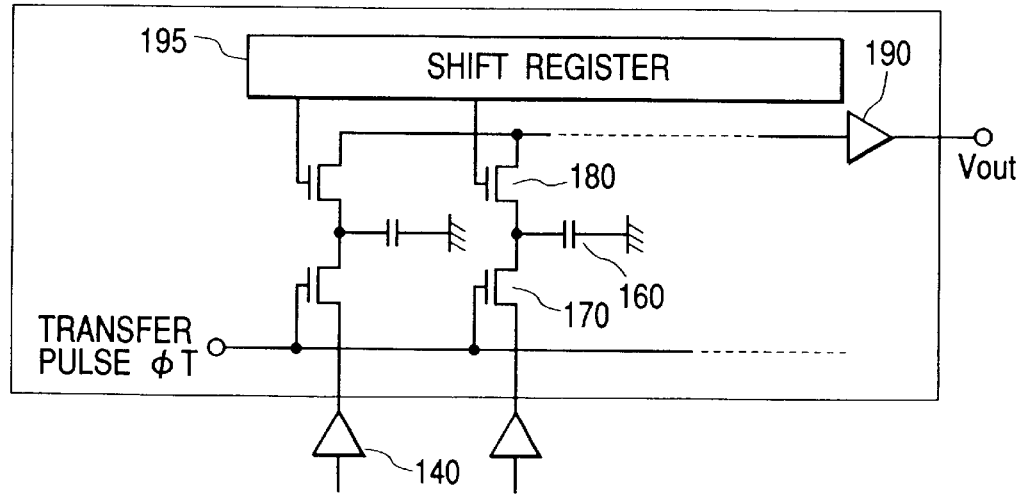
FIG. 35 is a schematic circuit diagram for explanation of an example of an output circuit.

The second thin film transistor 124 in each of the unit cells is selected every row by a horizontal scanning circuit (a shift register, or the like) 120, and a signal is read from the storage capacity 122 in each of the unit cells to an output line 125. The signal is inputted to an output circuit 130 through an amplifier 140 which is connected to the output line 125 and then sequentially outputted for each of columns by the output circuit 130. The connection of the amplifier 140 to each of the signal lines is effective for the following reasons. That is, in the radiation image pickup device of a large-scaled circuit substrate (for example, the size of 20 cm×20 cm, or 43 cm×43 cm) formed on a glass substrate, since the parasitic capacitance consisting of the capacitance between the wiring cross portion of the output line and the gate of the thin film transistor and the source connected to the output line, etc., is large to the degree of several tens pF to 100 Pf as compared with the capacitance (normally about 0.5 to 3 Pf) of the electric charge storage capacity in the radiation image pickup device, the ratio of the signal to the noise is sufficiently large. The respective storage capacities 122 and the respective output lines 125 are set to a potential Vv through the transistor 124 by the output line reset transistor 150. The output circuit 130 includes, for example, a sampling storage capacity 160 and a transistor 170 that connects the sampling storage capacity and the common output line, which are disposed for each of the output lines (refer to the schematic circuit diagram shown in FIG. 35). In this output circuit 30, the electric signals from the output line are sequentially stored in the sampling storage capacity 160 in response to a transfer pulse $\phi$T, and timing pulses of $\phi$H1, $\phi$H2, . . . are sequentially inputted to the transistors 180 in the circuit from a scanning circuit 195 such as a shift register, to thereby sequentially turn on the transistors 180, and the signals are read to the buffer amplifier 190 connected to the common output line from the sampling storage capacity 160 for each of the columns and then outputted ($V_{OUT}$).

Figure 27:
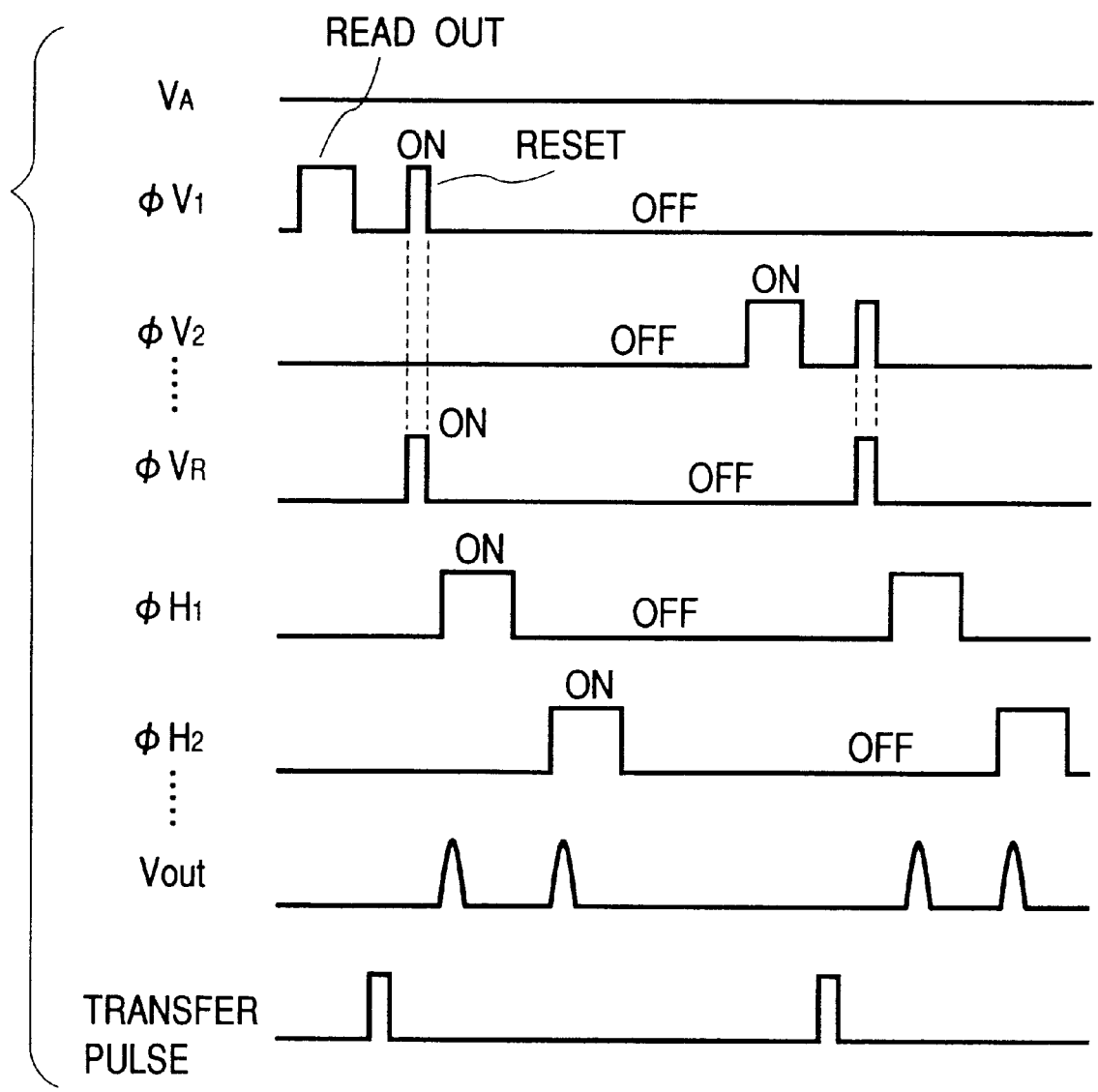
FIG. 27 is a timing chart for explanation of an example of the operation of the radiation image pickup device.

FIG. 27 shows an example of a timing chart for driving the x-ray image pickup device shown in FIG. 26.

It is assumed that a voltage given to the gate of the transistor 123 is a given voltage (voltage VA). In order to reset the storage capacity 122 and the output line 125, the output line reset transistor 150 connected to the reset potential $V_V$ turns on with $\phi V_R$ as $V_R$, and $\phi V_1$ turns on at the same time (reset mode). Thereafter, $\phi V_R$ and $\phi V_1$ turn off, and the x-ray sensor cell 121 comes to a storage mode. Subsequently, a pulse is added to $\phi V_1$ by the horizontal scanning circuit 120, and the signals stored in the storage capacity 122 are read to the respective output lines 125 (read mode). Thereafter, after the electric charges have been transferred to the sampling storage capacity (not shown) by the transfer pulses together, the respective horizontal scanning operations are conducted as $\phi$H1, $\phi$H2, . . . , to thereby sequentially output signals from the sampling storage capacity (Vout). After the stored electric charges have been transferred to the output lines 125, the operation returns to the reset mode again.

The above cycle is conducted with respect to the respective horizontal lines in the same manner to sequentially read the information.

The transistor 150 which functions as the reset means may turn on ($\phi V_R$ is in an on-state) in a state where the transistor 124 which functions as the reading means turns off ($\phi V_i$ is in an off-state) immediately before the $\phi V_i$ (i=1, 2, 3, ...) of the read mode turns on, to thereby further reset only the output lines. In this case, other operation may be conducted in the same manner as that in FIG. 27. The above operation can prevent a phenomenon (phenomenon called "blooming" by CCD or the like) in which the electric charges are leaked to the output lines from the storage capacities through the switches 124 and adversely affect other cell reading operation when intense radiations are made incident to a part of the image pickup region of the image pickup device.

In the x-ray sensor shown in FIG. 25, the $p^+$ layer 330 and $n^+$ layer 310 on a portion that detects the x-rays become insensitive bands of the radiation. The conversion of the x-rays into carriers is effectively conducted in the depletion layer.

Since a given voltage VA is always applied to the thin film transistor 123, another electrode of the sensor cell 121 always becomes VA-VT. For that reason, the sensor cell 121 is always applied with the given voltage, and the thickness of the depletion layer is not changed, thereby being capable of conducting stable operation.

Figure 28:
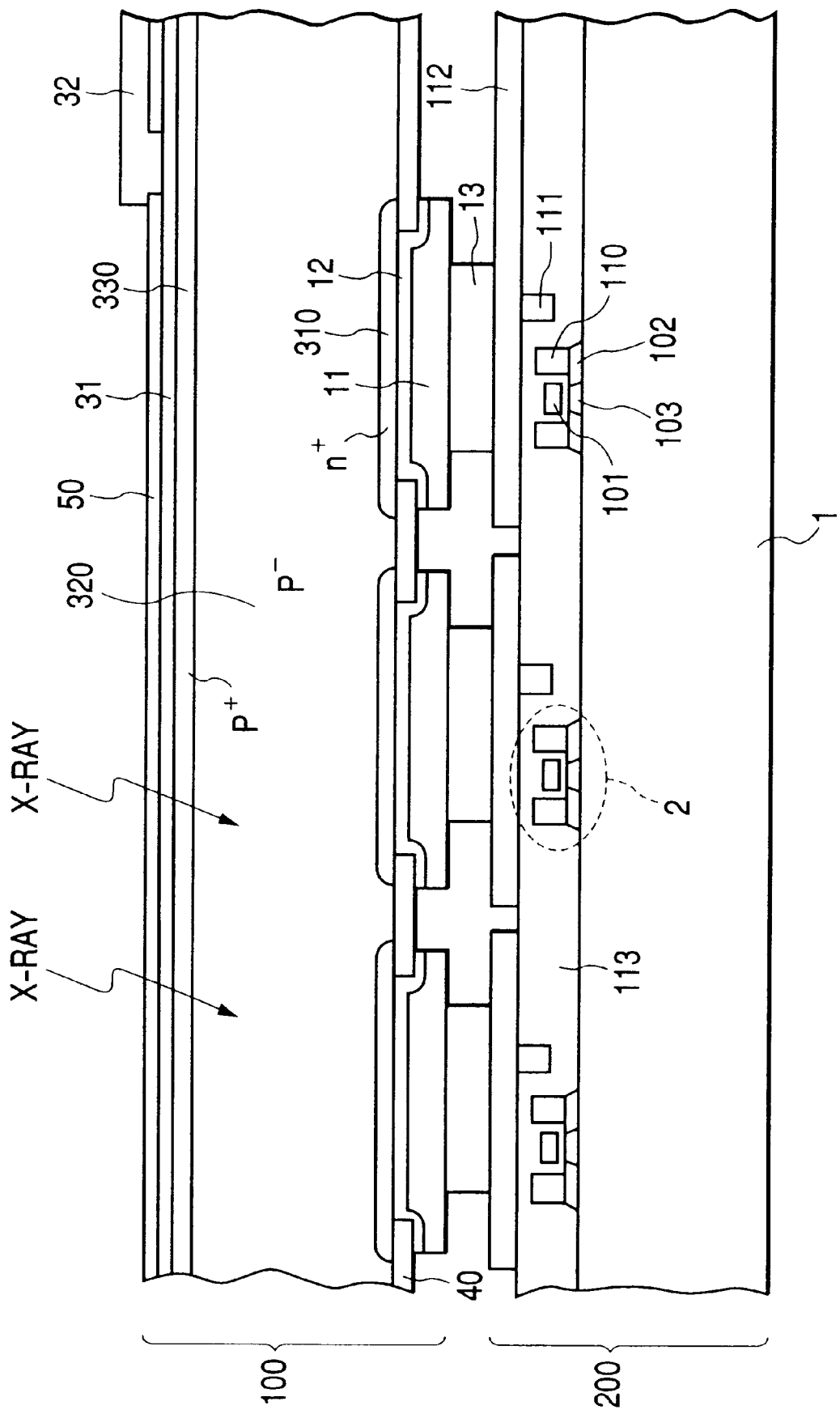
FIGS. 28, 29, 30, 31 and 32 are schematically cross-sectional views showing an x-ray sensor for explanation of other examples of a radiation image pickup device in accordance with the present invention.

FIG. 28 is a schematically cross-sectional view showing another example of an x-ray sensor in accordance with the present invention. As shown in the figure, this embodiment shows an example in which the x-ray sensing portion 100 of the x-ray sensor shown in FIG. 24 is different in polarity, and shows an example in which a $p^-$ type or i-type single crystal semiconductor is used as the high-resistive x-ray detecting portion. The material of the single crystal high resistant portion ($p^-$ region in this example) 320 is preferably GaAs since the resistance is high (>$10^7$ Ωcm), the dark current (band gap is 1.5 Ev) is small, and a large-diameter wafer (6 inches $\phi$) can be produced. Reference numeral 310 denotes an $n^+$ layer, and 330 is a $p^+$ region.

Figure 29:
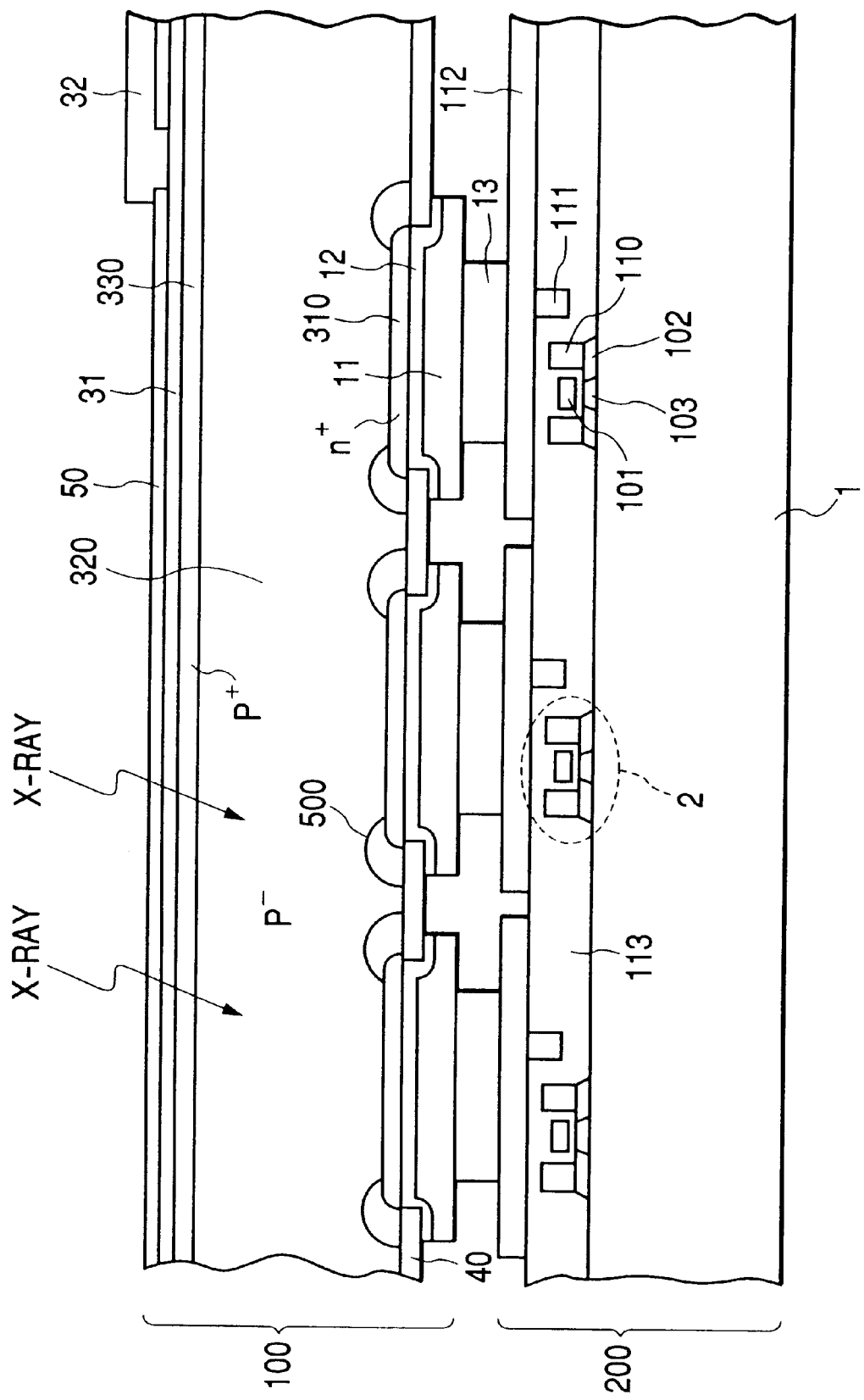

FIG. 29 is a schematically cross-sectional view showing another example of an x-ray sensor in accordance with the present invention.

This embodiment shows an example in which the x-ray sensing portion 100 of the x-ray sensor shown in FIG. 29 is different in polarity, and a $p^-$ type or i-type single crystal semiconductor ($p^-$ region is the figure) is used as the high-resistive x-ray detecting portion. In this example, an n region 3500 (which forms a guard region) lower in density than $n^+$ of an $n^+$ layer 310 is disposed in the periphery of the $n^+$ layer 310. With this arrangement, the peripheral rapid electric field is relaxed when a high voltage is applied to the x-ray detector, to thereby improve the withstand voltage of the p-n junctions.

Figure 30:
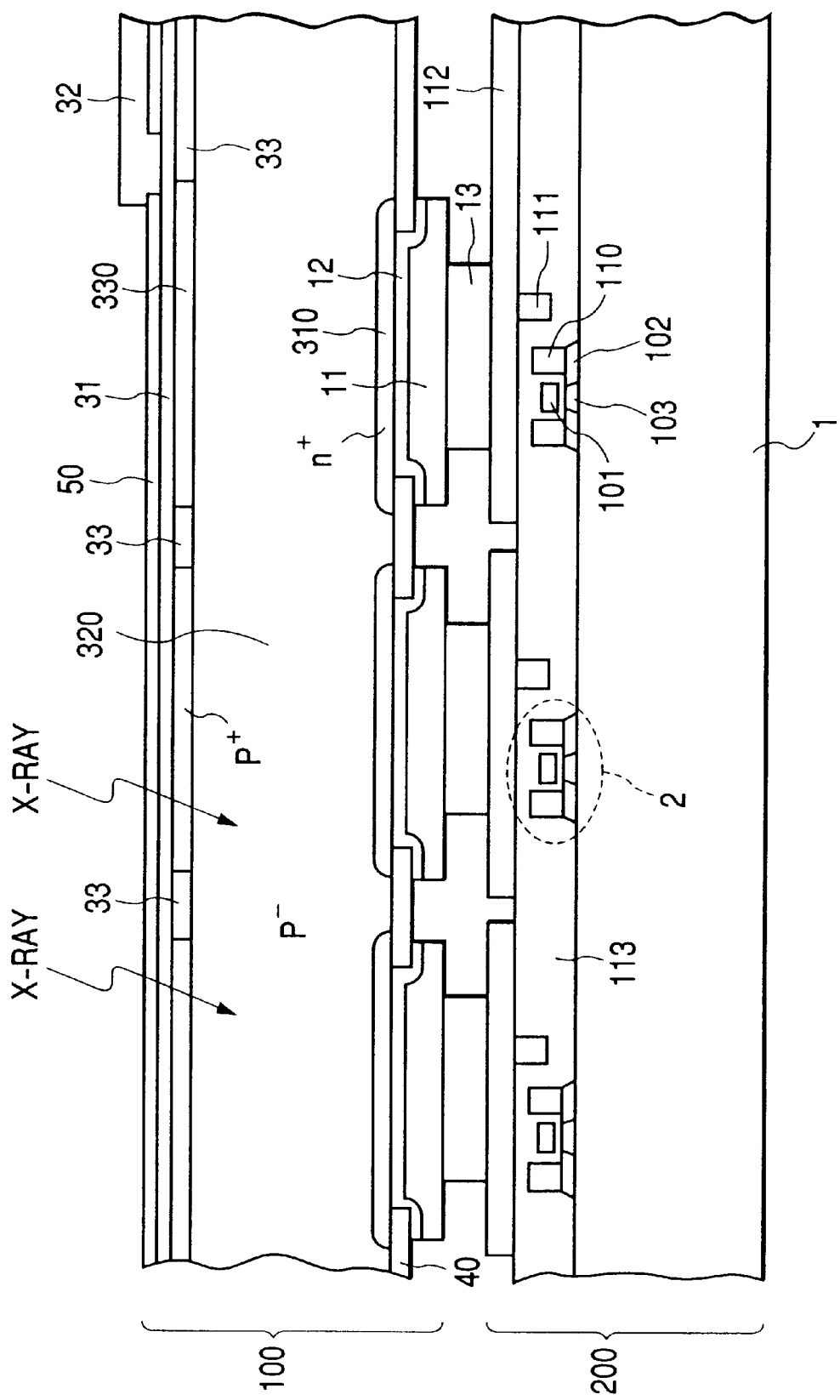

FIG. 30 is a schematically cross-sectional view showing another example of an x-ray sensor in accordance with the present invention.

This embodiment shows an example in which the x-ray sensing portion 100 of the x-ray sensor shown in FIG. 29 is different in polarity, and a $p^-$ type or i-type single crystal semiconductor (the $p^-$ region 320 in the figure) is used as the high-resistive x-ray detecting portion. In this example, an upper $p^+$ region 330 is separated, with the effect of improving the resolution. Reference numeral 33 denotes an insulating film that separates the $p^+$ region 30.

In FIG. 30, if the $p^-$ region 320 is made reverse electrically conductive type $n^-$, because the depletion layer extends from the surface side and a depletion layer is disposed on a portion to which x-rays are frequently made incident, the sensitivity and the resolution are stabilized. However, it is required that the depletion layer extend over the entire thickness of the $n^-$ region between $p^+$ and $n^+$.

Figure 31:
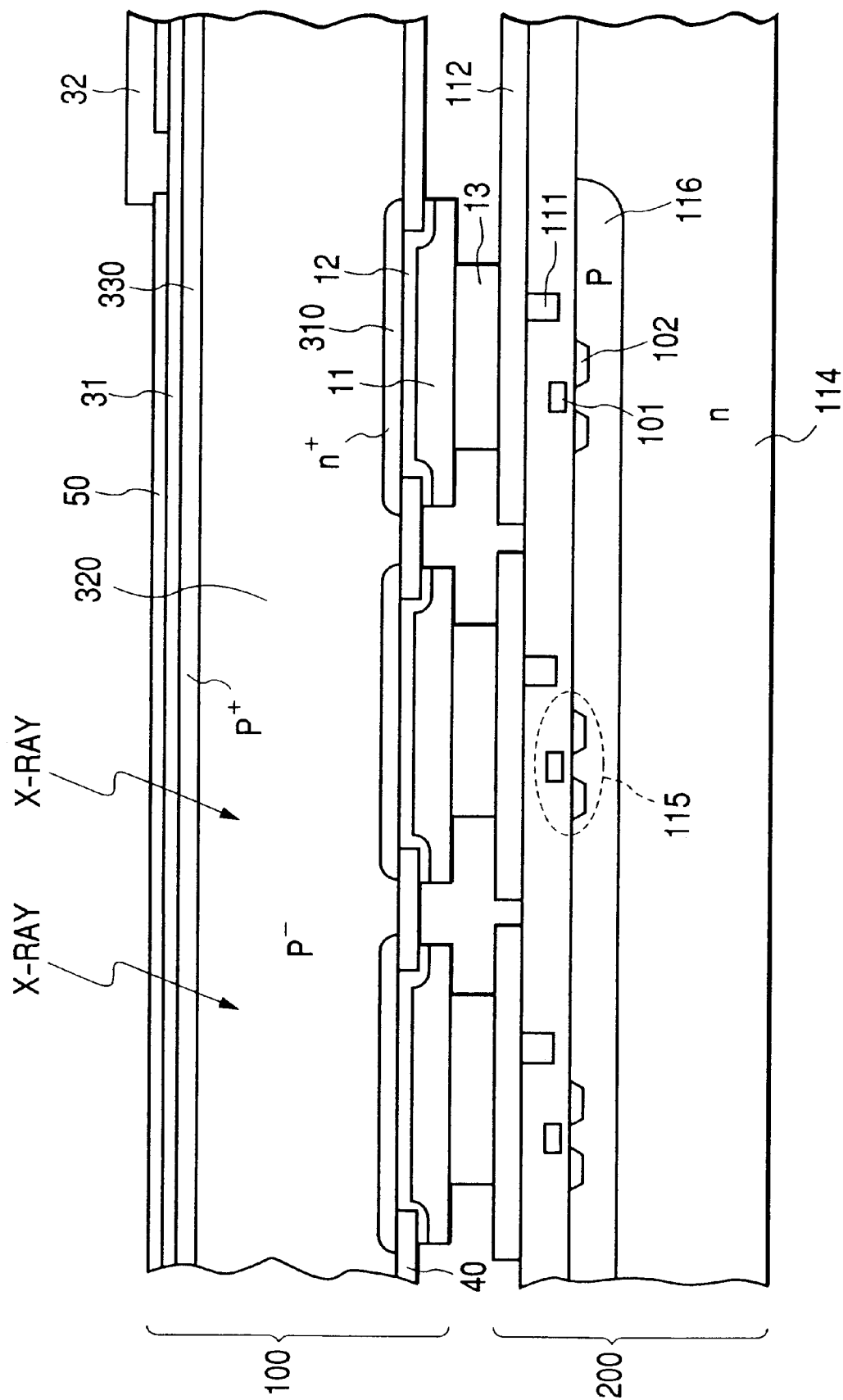

FIG. 31 is a schematically cross-sectional view showing an x-ray sensor in accordance with another embodiment of the present invention.

FIG. 31 shows an example in which the lower substrate of the x-ray sensor shown in FIG. 28 is formed of a single crystal substrate, and the x-ray sensor shown in FIG. 11 is different in polarity than the x-ray sensing portion 100. In this example, with the use of the single crystal substrate 114, the peripheral circuits can be disposed on the lower substrate, thus further improving the function and reading at a high speed. The transistor 115 is formed by forming a gate electrode on the p region 116.

Figure 32:
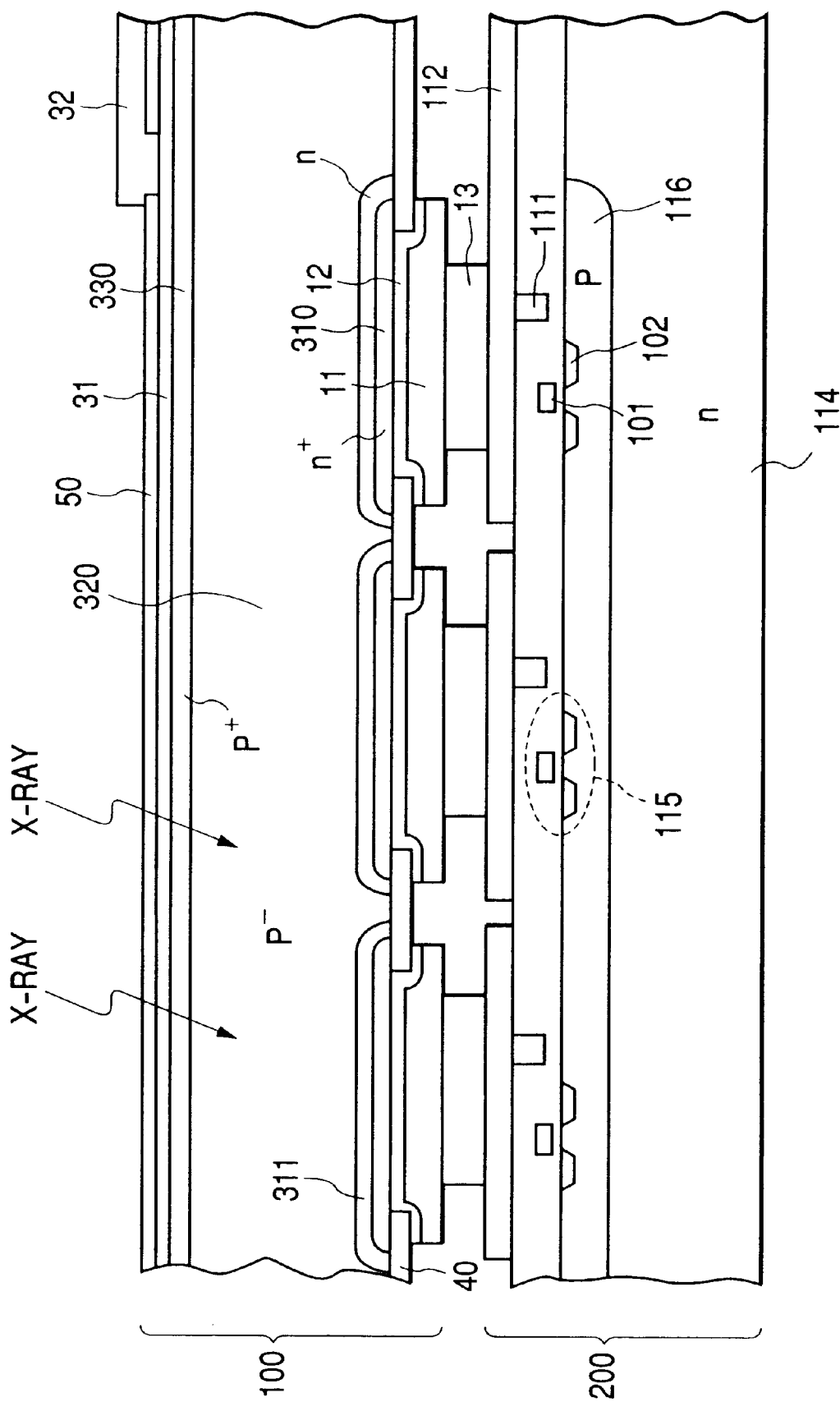

FIG. 32 is a schematically cross-sectional view showing another example of an x-ray sensor in accordance with the present invention. Referring to FIG. 32, in the x-ray sensor shown in FIG. 31, an n-type region 311, lower in density of impurities than the $n^+$ region 310, is disposed in the entire periphery of the $n^+$ region 310. With the above structure, the electric field in the periphery of the $n^+$ region 310 at the p-n junction is reduced, thereby improving the withstand voltage of the p-n junction and reducing the dark current in the depletion layer region.

Figure 33:
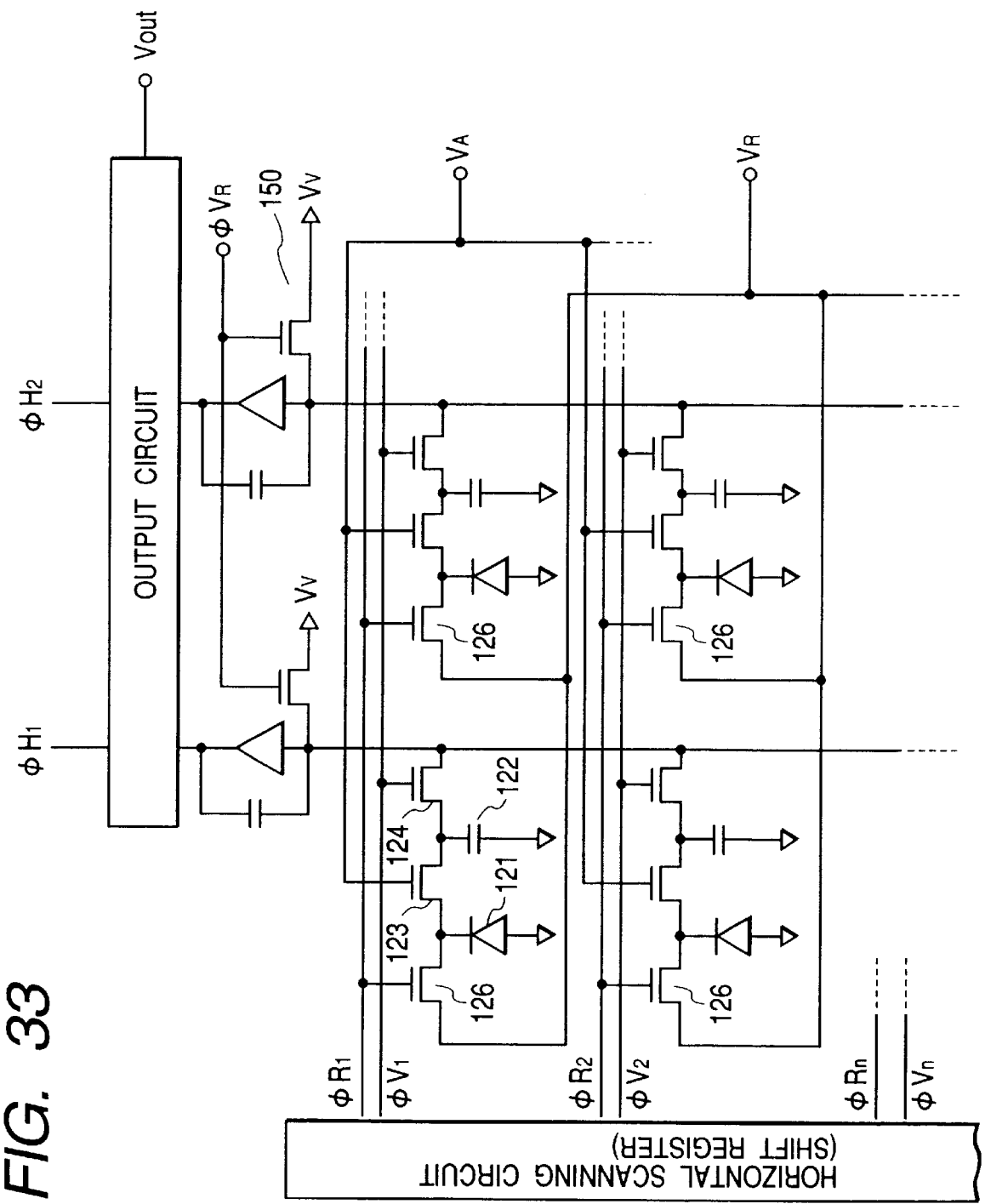
FIG. 33 is a schematically equivalent circuit diagram for explanation of another example of a radiation image pickup device in accordance with the present invention.

FIG. 33 is a schematically equivalent circuit diagram for explanation of another example of an x-ray image pickup device in accordance with the present invention. This embodiment shows an example in which the sensor cell 121 in the schematically equivalent circuit diagram shown in FIG. 12 is reversed in polarity.

Figure 34:
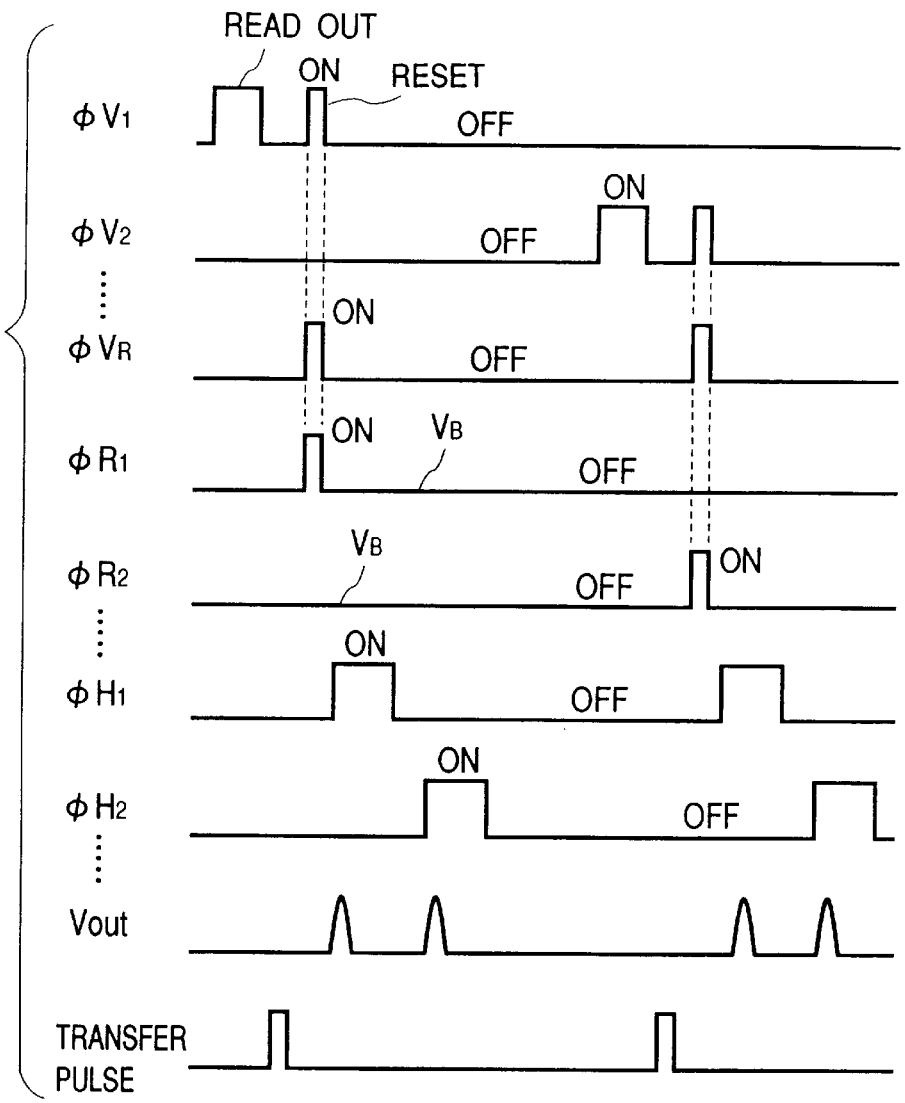
FIG. 34 is a timing chart for explanation of an example of the operation of the radiation image pickup device.

FIG. 34 is a timing chart for explanation of an example of the driving operation of the above x-ray image pickup device.

$\phi R_1, \phi R_2, \ldots, \phi V_1, \phi V_2, \ldots$ are synchronized with $\phi V_R$, respectively, to drive the transistors 124, 126 and 130 so that the sensor cell (sensor portion) 121 is reset. If the voltage of $V_B$ is applied to the gate of the reset transistor 126 without making the reset transistor 126 in the complete off-state when $\phi R_1$, and $\phi R_2$ are off, intense input x-rays are inputted to the sensor portion. Then, when large electric charges $Q_{Large}$ are stored in the storage capacity 122 (capacitance $C_1$), $V_{Large}=Q_{Large}/C_1$ is not larger than $V_B-V_{TH}$. As a result, an excessive voltage can be prevented from being applied to the transistor 124. The excessive voltage is, for example, a voltage larger than $V_{max}$ of the thin film transistor 124 shown in FIG. 3C, and when the voltage of $V_{max}$ or higher is stored in the storage capacity (C) 122, the carriers flow out to the output side of the transistor 124, to thereby have great influence on an image. An influence on the image which is called "blooming" by CCD can be eliminated by controlling the driving operation of the transistor 126 as described.

It is needless to say that even if the polarity of the x-ray sensing portion 100 is changed, in the schematically equivalent circuit diagrams as shown in FIGS. 13 to 19, those circuits also can be applied by reversing the polarity of the x-ray sensing portion.

Figure 20:
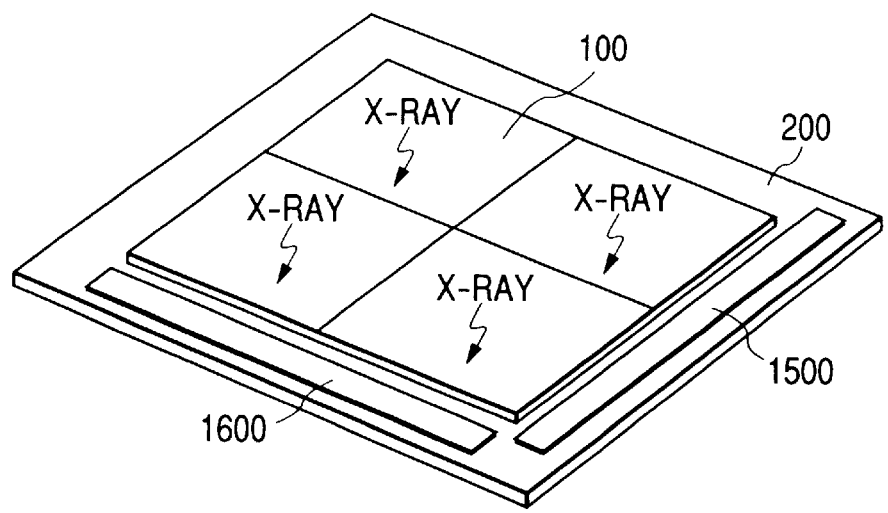
FIG. 20 is a schematically perspective view showing one structural example of the x-ray image pickup device.

FIG. 20 is a schematically perspective view showing one example in which a plurality of x-ray sensing portions 100 are combined together on a substrate 200 on which a reading circuit and so on are formed on an insulating substrate, to thereby fabricate a large-screen radiation image pickup device. In the figure, reference numerals 1500 and 1600 denote a driver circuit and an output circuit, respectively, which are located on the reading portion 200, which functions as a circuit substrate portion. A glass substrate is used as the substrate 1 of the reading portion 200, thereby enabling the image pickup device to be made large.

FIG. 21 is a schematic diagram showing an example of a medical diagnosing device using an image pickup device of the present invention.

Referring to FIG. 21, reference numeral 1001 denotes an x-ray tube as an x-ray generation source, 1002 is an x-ray shutter that controls the open/close of the x-ray penetration, 1003 is an irradiation cylinder or a movable diaphragm, 1004 is an object to be photographed, 1005 is a radiation detector according to the present invention, and 1006 is a data processing unit that data-processes a signal from the radiation detector 1005. Reference numeral 1007 denotes a computer that displays an x-ray image, etc. on a display 1009 such as CRT on the basis of a signal from the data processing unit 1006, and controls the x-ray tube 1001 through a camera controller 1010, an x-ray controller 1011 and a capacitor-type high-voltage generator 1012 to control the amount of generated x-rays.

As is described above, the present invention provides the following advantages.

(1) Since the applied electric field of the radiation detecting portion to which a high voltage is applied is held constant, the linearity of the reading sensitivity of the sensor can be maintained.

Since the thickness of the depletion layer can be held constant in the x-ray detecting portion with the p-n junction structure when the applied voltage is constant, the quantum efficiency can be held constant in a high state. The neutral region becomes a detection insensitive band.

Even in the electrically conductivity modulation type, if the electric field is held constant, the ratio of occurrence of electric charges can be held constant, and the direct contact property can be held constant.

(2) When an excessive radiation is inputted, the carrier overflow of the sensor through the switch can be prevented.

(3) The residual image can be reduced.

(4) The sensitivity can be made high.

(5) Since the reading circuit and the radiation detecting portion on the insulating substrate are laminated one on another, the opening ratio is increased, and the characteristics adaptive to the moving image with the lowered noise and with a high S/N are obtained by the thin film transistor, thus providing a radiation image pickup device high in reliability.

(6) Since the thin film transistor made of non-single crystal semiconductor on the insulating substrate is used, a large-area radiation image pickup device is obtained with the insulating substrate as a base.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A radiation image pickup device, comprising:
   a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;
   an output line that outputs the electric charges read from said plurality of input pixels, said output line connected to said plurality of input pixels; and
   switching means for resetting the electric charge storing means,
   wherein at least the control means, the electric charge storing means and the reading means are formed on the same insulating substrate.

2. The radiation image pickup device according to claim 1, wherein the signal based on the electric charges is a signal based on a potential.

3. The radiation image pickup device according to claim 1, further comprising sensor potential fixing means for setting the potential of one terminal of the electric charge converting means to a desired potential.

4. The radiation image pickup device according to claim 3, wherein said switching means is connected to stored potential fixing means for setting the potential of one terminal of the electric charge storing means to a desired potential.

5. The radiation image pickup device according to claim 3, wherein one end of said switching means is connected to said output line, and the other end of said switching means is connected to stored potential fixing means for setting the potential of one terminal of the electric charge storing means to a desired potential.

6. The radiation image pickup device according to claim 1, wherein said switching means is connected to stored potential fixing means for setting the potential of one terminal of the electric charge storing means to a desired potential.

7. The radiation image pickup device according to claim 1, wherein one end of said switching means is connected to said output line, and the other end of said switching means is connected to stored potential fixing means for setting the potential of one terminal of the electric charge storing means to a desired potential.

8. The radiation image pickup device according to claim 1, wherein the electric charge converting means has a p-n structure.

9. The radiation image pickup device according to claim 8, wherein a guard region that relaxes an electric field is provided in the periphery of an electrically conductive semiconductor region which constitutes a p-n structure.

10. The radiation image pickup device according to claim 8, wherein the p-n structure of the electric charge converting means is fabricated on a single crystal semiconductor substrate.

11. The radiation image pickup device according to claim 10, wherein the semiconductor substrate has an energy band gap of 1 Ev or higher in a band gap.

12. The radiation image pickup device according to claim 8, wherein an electrically conductive type semiconductor region lower in the density of impurities than the an electrically conductive type semiconductor region that relaxes an electric field is provided over the entire region of an electrically conductive type semiconductor region which constitutes a p-n structure.

13. The radiation image pickup device according to claim 8, wherein at least the control means and the reading means comprise n-type thin film transistors, the p-n structure includes a p-n junction, a terminal of the n region of the p-n junction is electrically connected to a source or a drain of the n-type thin film transistor of the control means, a terminal of the p region of the p-n junction is connected to bias means, and the p-n junction is reversely biased so that a depletion layer sufficient to detect the radiation is formed in the semiconductor substrate.

14. The radiation image pickup device according to claim 1, wherein the electric charge converting means comprises an electrically conductive modulation type element.

15. The radiation image pickup device according to claim 1, wherein the input pixels are arranged in a two-dimensional matrix.

16. The radiation image pickup device according to claim 1, wherein the electric charge converting means is laminated on the insulating substrate.

17. The radiation image pickup device according to claim 1, further comprising means for storing a signal including an image information component and a noise component, means for storing the noise component, and means for subtracting the noise component from the signal including the image information component and the noise component.

18. The radiation image pickup device according to claim 1, further comprising sensor potential fixing means for setting the potential of one terminal of the electric charge converting means to a desired potential,
    wherein said sensor potential fixing means gives a constant potential when said sensor potential fixing means is off, and when the potential of the electric charge storing means is an excessive potential, said potential fixing means functions as sweeping means for sweeping the excessive electric charges.

19. The radiation image pickup device according to claim 1, further comprising stored potential fixing means for setting the potential of one terminal of the electric charge storing means to a desired potential,
    wherein said stored potential fixing means gives a constant potential when said stored potential fixing means is off, and when the potential of the electric charge storing means is an excessive potential, said potential fixing means functions as sweeping means for sweeping the excessive electric charges.

20. The radiation image pickup device according to claim 1, further comprising sensor potential fixing means for setting the potential of one terminal of the electric charge converting means to a desired potential, and stored potential fixing means for setting the potential of one terminal of the electric charge storing means to a desired potential,
    wherein at least one of the sensor or stored potential fixing means functions as sweeping means.

21. The radiation image pickup device according to claim 1, wherein the electric charge converting means comprises single crystal GaAs.

22. The radiation image pickup device according to claim 1, wherein
    the electric charge storing means is reset by turning on at least the switching means and the reading means at the same time,
    the electric charges generated due to the incident radiation by the electric charge converting means in the electric charge storing means are stored by turning off the switching means and the reading means, and
    the signal based on the electrical charges is read by said reading means when said switching means is turned off to output a signal electric charge to said output line from the storing means.

23. The radiation image pickup device according to claim 22, wherein said output line may be reset and only said output line is reset by turning on said switching means and turning off the reading means.

24. The radiation image pickup device according to claim 1, wherein at least the reading means and the control means comprise thin film transistors, and the thin film transistors comprise a non-single crystal semiconductor.

25. The radiation image pickup device according to claim 1, wherein at least the control means, the storing means and the reading means are the same layer structure as a lower electrode, an insulating film, a high-resistive semiconductor film, a low-resistive semiconductor film and an upper electrode on one face of the insulating substrate.

26. The radiation image pickup device according to claim 1, wherein a plurality of semiconductor substrates which form a radiation converting means are disposed on the insulating substrate on which at least the control means, the storing means and the reading means are fabricated.

27. The radiation image pickup device according to claim 1, wherein at least the control means, the storing means and the reading means are the same layer structure as a lower electrode, an insulating film, a high-resistive semiconductor film, a low-resistive semiconductor film and an upper electrode on one face of an insulating substrate.

28. A radiation image pickup device, comprising:
    a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;
    an output line that outputs for outputting the electric charges read from said plurality of input pixels, said output line connected to said plurality of input pixels; and
    switching means for resetting the electric charge storing means,
    wherein said the switching means is connected to stored potential fixing means for setting the potential of one terminal of the electric charge storing means to a desired potential.

29. The radiation image pickup device according to claim 28, further comprising sensor potential fixing means for setting the potential of one terminal of the electric charge converting means to a desired potential.

30. The radiation image pickup device according to claim 28, wherein one end of said the switching means is connected to said the output line side, and the other end of said the switching means is connected to stored potential fixing means for setting the potential of one terminal of the electric charge storing means to a desired potential.

31. The radiation image pickup device according to claim 28, wherein the electric charge converting means has a p-n structure.

32. The radiation image pickup device according to claim 31, wherein a guard region that relaxes an electric field is provided in the periphery of an electrically conductive semiconductor region which constitutes a p-n structure.

33. The radiation image pickup device according to claim 28, wherein the electric charge converting means comprises an electrically conductive modulation type element.

34. The radiation image pickup device according to claim 28, wherein the input pixels are arranged in a two-dimensional matrix.

35. The radiation image pickup device according to claim 28, wherein at least the control means, the electric charge storing means and the reading means are formed on the same insulating substrate.

36. The radiation image pickup device according to claim 35, wherein the electric charge converting means is laminated on the insulating substrate.

37. The radiation image pickup device according to claim 28, wherein at least the reading means and the control means comprise thin film transistors, and the thin film transistors comprise a non-single crystal semiconductor.

38. The radiation image pickup device according to claim 27, wherein a plurality of semiconductor substrates which form a radiation converting means are disposed on the insulating substrate on which at least the control means, the storing means and the reading means are fabricated.

39. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means, wherein one end of said switching means is connected to said output line, and the other end of said switching means is connected to stored potential fixing means for setting the potential of one terminal of the electric charge storing means to a desired potential.

40. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means, wherein a guard region that relaxes an electric field is provided in the periphery of an electrically conductive semiconductor region which constitutes a p-n structure.

41. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means;

means for storing a signal including an image information component and a noise component;

means for storing the noise component; and means for subtracting the noise component from the signal including the image information component and the noise component.

42. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels;

switching means for resetting the electric charge storing means;

sensor potential fixing means for setting the potential of one terminal of the electric charge converting means to a desired potential; and stored potential fixing means for setting the potential of one terminal of the electric charge storing means to a desired potential, wherein at least one of the sensor or stored potential fixing means functions as sweeping means.

43. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means, wherein the electric charge converting means has a p-n structure, and wherein an electrically conductive type semiconductor region lower in the density of impurities than the an electrically conductive type semiconductor region that relaxes an electric field is provided over the entire region of an electrically conductive type semiconductor region which constitutes a p-n structure.

44. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means, wherein the electric charge converting means has a p-n structure, and wherein at least the control means and the reading means comprise n-type thin film transistors, the p-n structure includes a p-n junction, a terminal of the n region of the p-n junction is electrically connected to a source or a drain of the n-type thin film transistor of the control means, a terminal of the p region of the p-n junction is connected to bias means, and the p-n junction is reversely biased so that a depletion layer sufficient to detect the radiation is formed in the semiconductor substrate.

45. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means, wherein at least the control means, the storing means and the reading means are the same layer structure as a lower electrode, an insulating film, a high-resistive semiconductor film, a low-resistive semiconductor film and an upper electrode on one face of an insulating substrate.

46. A radiation image pickup device, comprising:

a plurality of input pixels comprising electric charge converting means for converting an incident radiation into electric charges, electric charge storing means for storing the electric charges converted by the electric charge converting means, control means for controlling an electric field applied to the electric charge converting means, provided between the electric charge converting means and the electric charge storing means, and reading means for reading a signal based on the electric charges stored in the electric charge storing means;

an output line that outputs for outputting the electric charges read from said plurality of input pixels, said output line connected to said plurality of input pixels; and switching means for resetting the electric charge storing means, wherein a plurality of semiconductor substrates which form a radiation converting means are disposed on an insulating substrate on which at least the control means, the storing means and the reading means are fabricated.

* * * * *

UNITED STATES PATENT AND TRADEMARK OFFICE
CERTIFICATE OF CORRECTION

PATENT NO. : 6,489,618 B1
DATED : December 3, 2002
INVENTOR(S) : Masakazu Morishita It is certified that error appears in the above-identified patent and that said Letters Patent is hereby corrected as shown below:

Column 3,
Line 9, "invention;" should read -- invention. --.
Line 25, "schematically" should read -- schematic --.

Column 5,
Line 10, "not shown," should read -- (not shown), --.
Line 52, "highspeed" should read -- high-speed --.

Column 8,
Line 57, "$Qmax\text{-}(V_4\text{-}V_{TH26}\text{-}V_v)C_1$." shoud read -- $Qmax =(V_A\text{-}V_{TH126}\text{-}V_v) C_1$. --.

Column 10,
Line 17, "of" should read -- of the --.

Column 14,
Line 66, "the an" should read -- an --.

Column 17,
Lines 22-23, "claim 27," should read -- claim 28, --.

Column 19,
Line 6, "the an" should read -- an --.

Signed and Sealed this

Second Day of September, 2003

JAMES E. ROGAN
*Director of the United States Patent and Trademark Office*